(12) United States Patent
Hosek et al.

(10) Patent No.: US 8,651,796 B2
(45) Date of Patent: *Feb. 18, 2014

(54) SUBSTRATE TRANSPORT APPARATUS WITH MULTIPLE INDEPENDENTLY MOVABLE ARTICULATED ARMS

(75) Inventors: Martin Hosek, Lowell, MA (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 110 days.

This patent is subject to a terminal disclaimer.

(21) Appl. No.: 13/113,476

(22) Filed: May 23, 2011

(65) Prior Publication Data

US 2011/0224822 A1 Sep. 15, 2011

Related U.S. Application Data

(63) Continuation of application No. 11/697,390, filed on Apr. 6, 2007, now Pat. No. 7,946,800.

(51) Int. Cl.
*B25J 9/10* (2006.01)

(52) U.S. Cl.
USPC ............. 414/744.5; 414/744.1; 414/941; 74/490.01; 74/490.03; 74/490.05; 901/15

(58) Field of Classification Search
USPC ............ 414/744.5, 744.1; 74/490.01, 490.03, 74/490.05; 901/15
See application file for complete search history.

(56) References Cited

U.S. PATENT DOCUMENTS

| | | | |
|---|---|---|---|
| 5,054,831 | A | 10/1991 | Ting et al. |
| 5,187,996 | A | 2/1993 | Torii et al. |
| 5,534,761 | A | 7/1996 | Crippa |
| 5,975,834 | A | 11/1999 | Ogawa et al. |
| 6,276,892 | B1 | 8/2001 | Haraguchi et al. |
| 6,364,599 | B1 | 4/2002 | Suwa et al. |
| 6,547,510 | B1 | 4/2003 | Beaulieu |
| 6,705,177 | B2 | 3/2004 | Okuno et al. |
| 6,742,977 | B1 | 6/2004 | Okayama et al. |
| 7,040,852 | B2 | 5/2006 | Mori et al. |
| 7,086,822 | B2 | 8/2006 | Maeda |
| 7,946,800 | B2 | 5/2011 | Hosek et al. |
| 2001/0036398 | A1 | 11/2001 | Hofmeister |
| 2002/0144782 | A1 | 10/2002 | Okuno et al. |
| 2003/0035709 | A1 | 2/2003 | Cox et al. |
| 2003/0082042 | A1 | 5/2003 | Woodruff et al. |

(Continued)

FOREIGN PATENT DOCUMENTS

| | | |
|---|---|---|
| DE | 19831578 | 6/1999 |
| EP | 0827814 | 3/1998 |

(Continued)

*Primary Examiner* — Scott Lowe
(74) *Attorney, Agent, or Firm* — Perman & Green, LLP; Colin C. Durham

(57) ABSTRACT

A substrate transport apparatus including a drive section having at least one drive shaft and at least two scara arms operably coupled to the at least one drive shaft, the at least one drive shaft being a common drive shaft for the at least two scara arms effecting extension and retraction of the at least two scara arms, wherein the at least two scara arms are coupled to each other so that, with the at least one drive shaft coupled to the at least two scara arms, rotation of the drive shaft effects extension and retraction of one of the at least two scara arms substantially independent of motion of another of the at least two scara arms.

10 Claims, 18 Drawing Sheets

(56) References Cited

U.S. PATENT DOCUMENTS

| | | | |
|---|---|---|---|
| 2003/0223853 | A1 | 12/2003 | Caveney et al. |
| 2004/0001750 | A1 | 1/2004 | Kremermani |
| 2005/0191155 | A1 | 9/2005 | Sakiya |
| 2005/0286993 | A1* | 12/2005 | Minami et al. ............. 414/744.5 |
| 2006/0210387 | A1* | 9/2006 | Saeki et al. ................ 414/744.5 |
| 2007/0020081 | A1 | 1/2007 | Gilchrist et al. |
| 2011/0224822 | A1 | 9/2011 | Hosek et al. |

FOREIGN PATENT DOCUMENTS

| | | |
|---|---|---|
| GB | 2376679 | 12/2002 |
| JP | 1093958 | 4/1989 |
| JP | 2093881 | 4/1990 |
| JP | 3152051 | 6/1991 |
| JP | 4014635 | 1/1992 |
| JP | 4015029 | 1/1992 |
| JP | 4044989 | 2/1992 |
| JP | 4119554 | 4/1992 |
| JP | 4235549 | 8/1992 |
| JP | 5040923 | 2/1993 |
| JP | 5319550 | 3/1993 |
| JP | 5096076 | 4/1993 |
| JP | 6007347 | 1/1994 |
| JP | 6026819 | 2/1994 |
| JP | 6120861 | 4/1994 |
| JP | 7005435 | 1/1995 |
| JP | 0072248 | 3/2000 |
| JP | 0133696 | 5/2000 |
| JP | 2002361577 | 12/2002 |
| JP | 2007044839 | 2/2007 |
| TW | I291915 | 1/2008 |
| WO | 8707078 | 11/1987 |
| WO | 03/043077 | 5/2003 |
| WO | 03101677 | 12/2003 |
| WO | 2004113205 | 12/2004 |
| WO | 2005002804 | 1/2005 |
| WO | 2005004230 | 1/2005 |
| WO | WO 2005/008769 * | 1/2005 |
| WO | 2006006554 | 1/2006 |
| WO | 2006137370 | 12/2006 |
| WO | 2007008797 | 1/2007 |

* cited by examiner

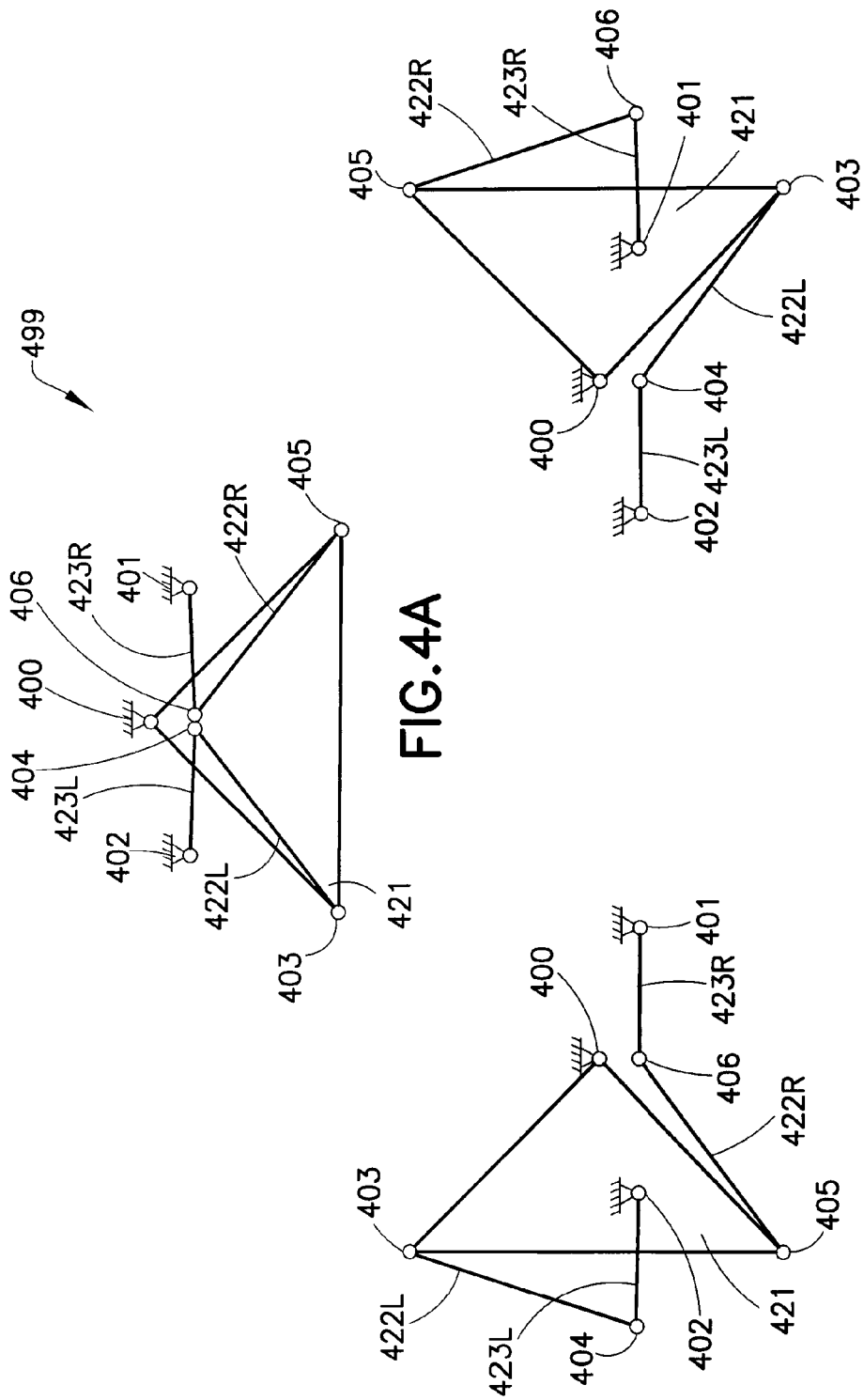

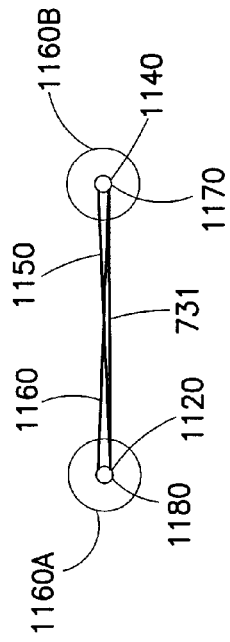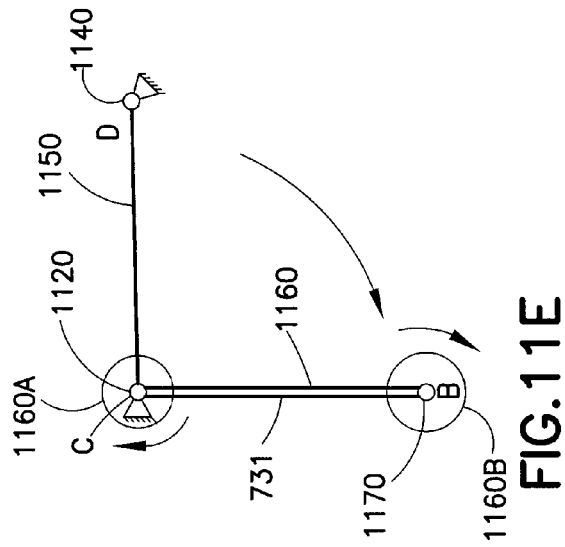
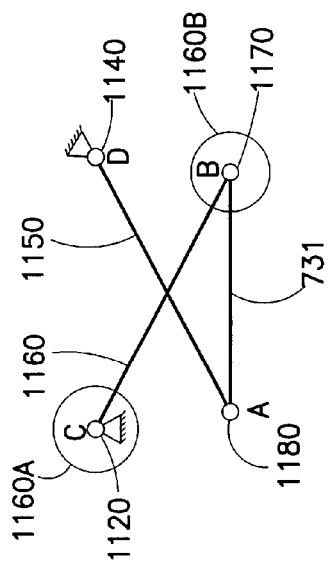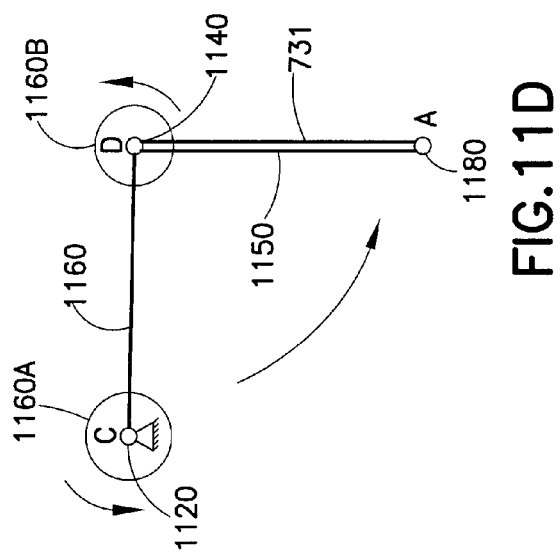
FIG.11C
FIG.11E
FIG.11B
FIG.11D

SUBSTRATE TRANSPORT APPARATUS WITH MULTIPLE INDEPENDENTLY MOVABLE ARTICULATED ARMS

This application is a continuation of and claims the benefit of U.S. patent application Ser. No. 11/697,390, filed on Apr. 6, 2007, the disclosure of which is incorporated herein by reference in its entirety.

BACKGROUND

1. Field

The disclosed embodiments relate to a substrate transport apparatus and, more particularly, to substrate transport apparatus with multiple movable arms.

2. Brief Description of Related Developments

Conventional non-coaxial side-by-side dual scara arms are offered for sale by several companies; the UTW and UTV series of robots by MECS Korea, Inc., the RR series of robots by Rorze Automation, Inc. and the LTHR, STHR and SPR series of robots by JEL Corp. An example of a side-by-side dual arm scara transfer device can be found in U.S. Pat. No. 5,765,444.

An exemplary configuration of a conventional non-coaxial side-by-side dual arm robot is shown in FIGS. 1 and 1A. The robot is built around a pivoting hub, which carries two scara arms or linkages. The left linkage has an upper arm, a forearm and an end effector coupled in series through revolute joints. A belt and pulley arrangement is used to constrain the motion of the left arm so that rotation of the upper arm with respect to the hub produces rotation of the forearm in the opposite direction (e.g. clockwise upper arm rotation causes counterclockwise forearm rotation). Another belt and pulley arrangement is used to maintain radial orientation of the end effector. The right linkage may be a mirror image of the left arm. The end effectors of the left and right arms move in different horizontal planes to allow for unrestricted motion of the two linkages of the robot. As can be seen in FIGS. 1B-1D, by rotating the left and right upper arms the respective linkages can be extended independently in a common radial direction with respect to the pivot point of the hub.

In the conventional side-by-side robots as shown in FIGS. 1A-D, the robot arms or linkages are actuated by a complex arrangement of three motors, which for example may be configured in a coaxial manner, coupled to the robot through hollow shafts. Typically the outermost shaft is coupled directly to the hub while the two inner shafts are coupled to the upper arms of the left and right linkages through independent belt and pulley arrangements. As may be realized, the larger the number of motors employed for effecting movement of the robot arm, the greater the burden on the control system controlling robot motion. Also, the larger the number of motors employed increases the potential for motor failure as well as the cost of the robot.

It would be advantageous to have a robot manipulator with independently movable arms with reduced complexity and improved reliability and cleanliness of the robotic system.

SUMMARY

In one exemplary embodiment, a substrate transport apparatus is provided. The apparatus includes a drive section having at least one drive shaft and at least two scara arms operably coupled to the at least one drive shaft, the at least one drive shaft being a common drive shaft for the at least two scara arms effecting extension and retraction of the at least two scara arms, wherein the at least two scara arms are coupled to each other so that, with the at least one drive shaft coupled to the at least two scara arms, rotation of the drive shaft effects extension and retraction of one of the at least two scara arms substantially independent of motion of another of the at least two scara arms.

In another exemplary embodiment, a substrate transport apparatus is provided. The apparatus includes a drive section with a drive shaft, two articulated arms, each being connected to the drive shaft for extension and retraction of each arm, and each arm having an end effector adapted for holding and transporting a substrate and a coupling system having a lost motion system operably coupling both articulated arms to the drive shaft, the lost motion system being arranged so that the lost motion system operates, when the drive shaft is rotated, to effect extension and retraction of one of the two articulated arms without substantially moving another of the two articulated arms.

In still another exemplary embodiment a substrate transport apparatus is provided. The apparatus includes a drive section with a drive shaft, multiple articulated arms connected to the drive section, each of the arms having an end effector for holding a substrate, and being capable of extension and retraction for linearly transporting the substrate and a coupling system having a substantially rigid base member coupling each arm to the drive shaft, the base member being movable relative to the drive section and being movably connected to the multiple articulated arms by movable joints allowing relative movement between each arm and the base member. The movable joints are arranged so that movement of the base member relative to the drive section generates relative movement between the base member and the multiple articulated arms at each of the movable joints causing extension and retraction of at least one of the multiple articulated arms without substantial articulation of at least another of the multiple articulated arms.

BRIEF DESCRIPTION OF THE DRAWINGS

The foregoing aspects and other features of the disclosed embodiments are explained in the following description, taken in connection with the accompanying drawings, wherein:

FIGS. 4A-C illustrate schematic views of a portion of the substrate transport apparatus in FIGS. 3A-3C, respectively shown in three different positions;

FIGS. 11A-E illustrate schematic views of a portion of the substrate transport apparatus in FIGS. 6A-6C, respectively shown in different positions in accordance with an exemplary embodiment.

DETAILED DESCRIPTION OF THE EXEMPLARY EMBODIMENT(S)

Figure 1:
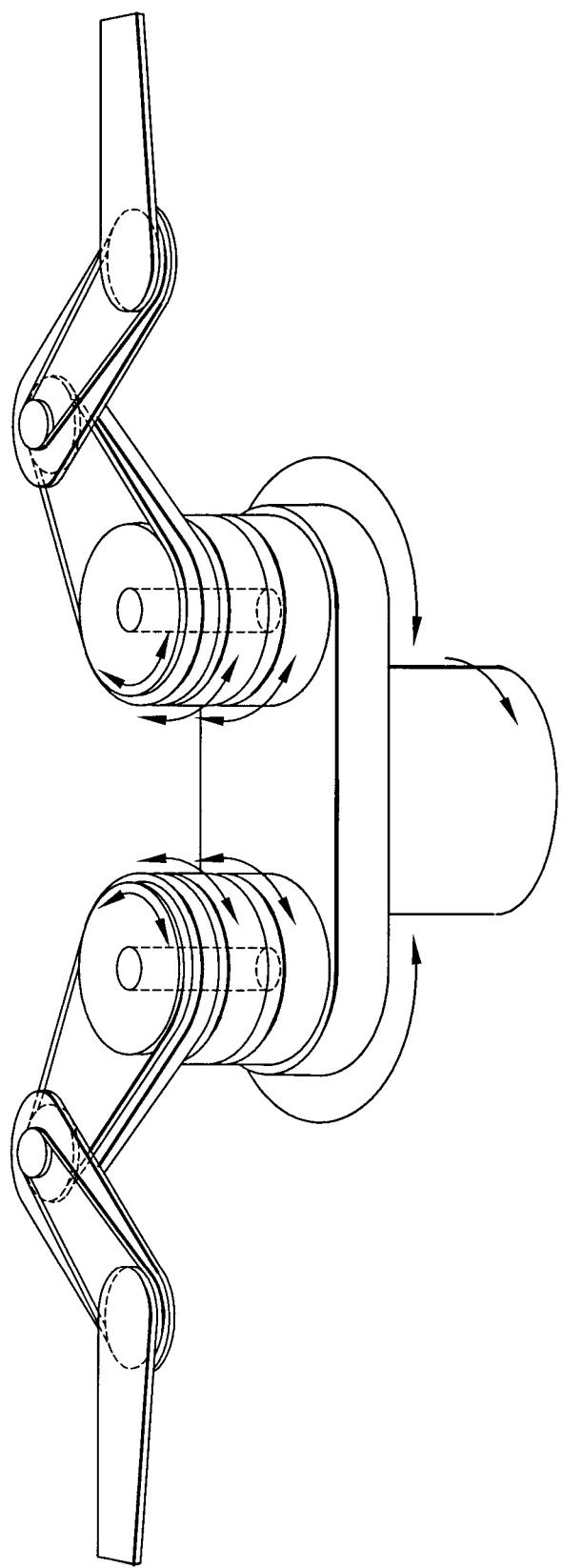
FIGS. 1 and 1A-D illustrate a conventional substrate transport apparatus.
Figure 1A:
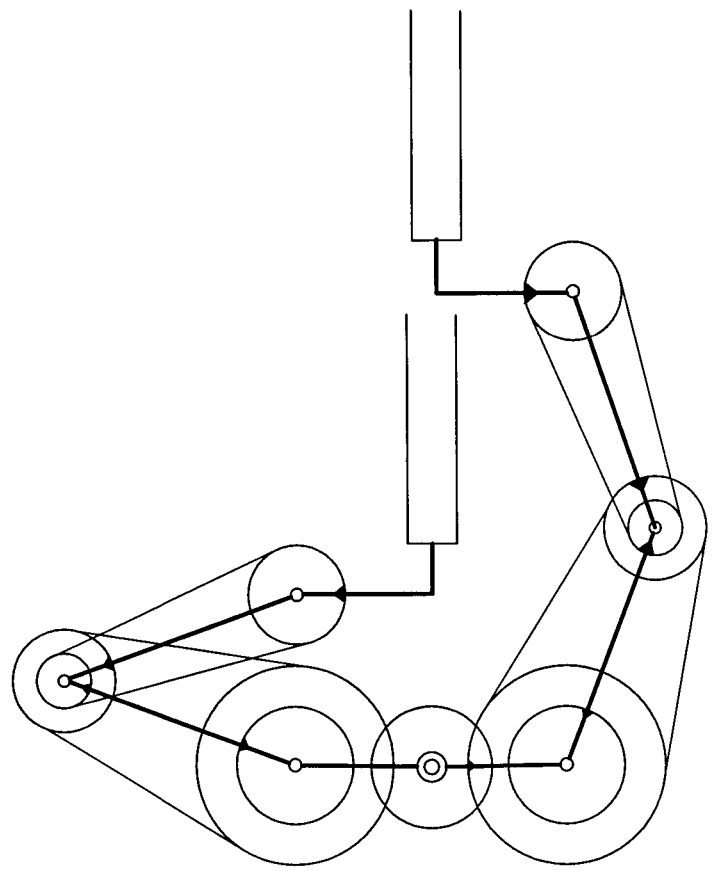
Figure 1D:
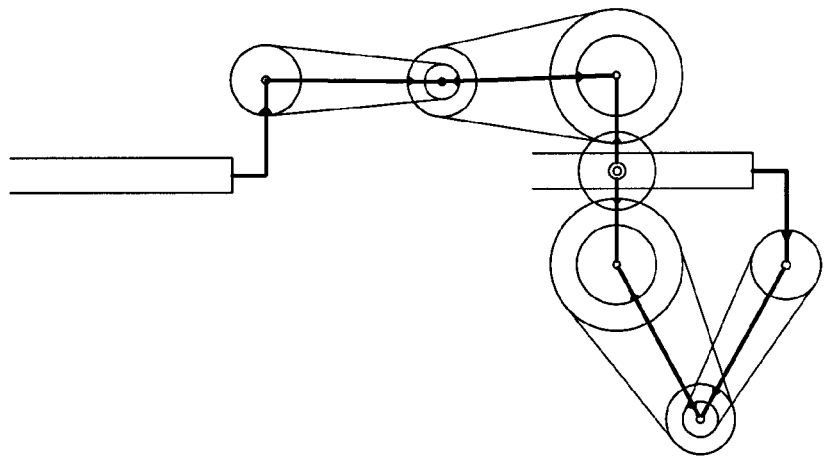
Figure 1C:
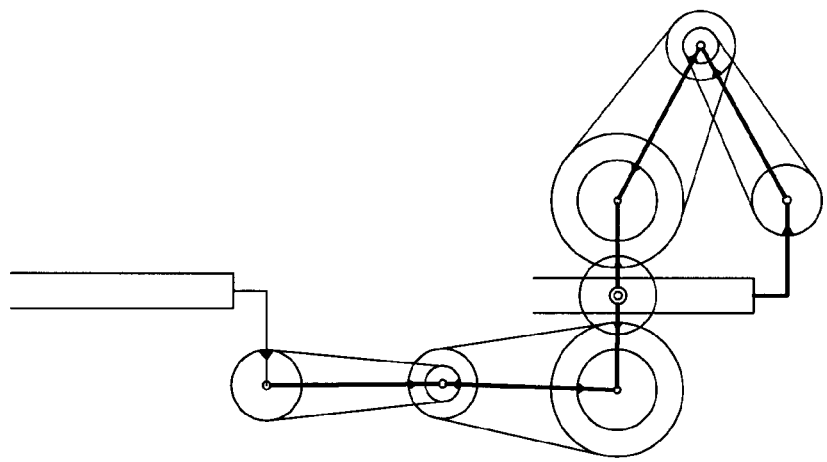
Figure 1B:
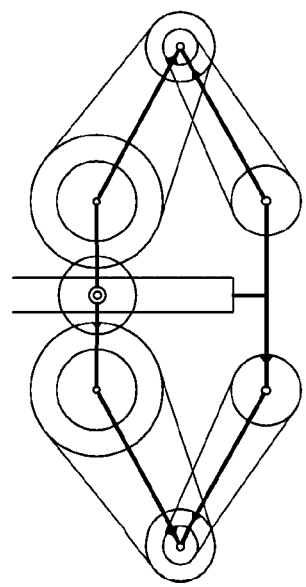
Figure 2A:
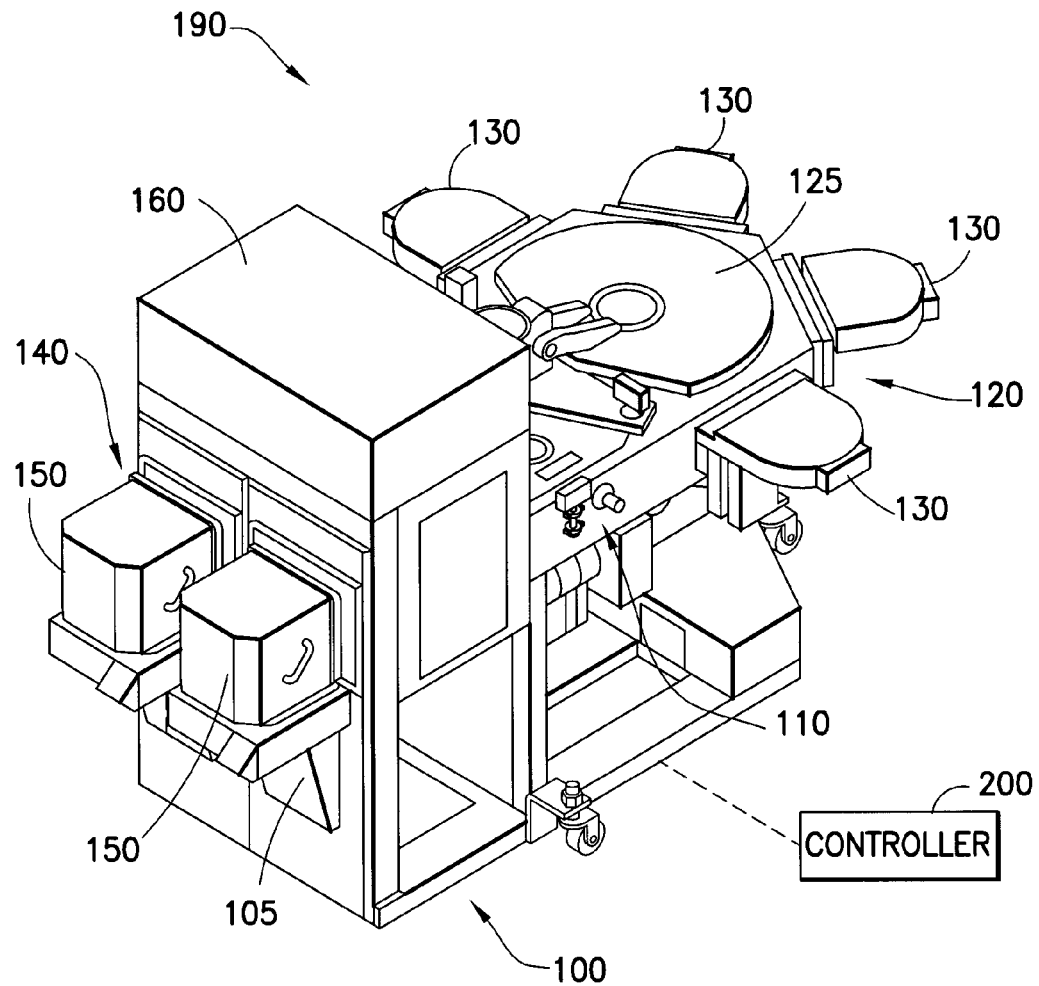
FIGS. 2A and 2B illustrate processing apparatus incorporating features of an exemplary embodiment.
Figure 2B:
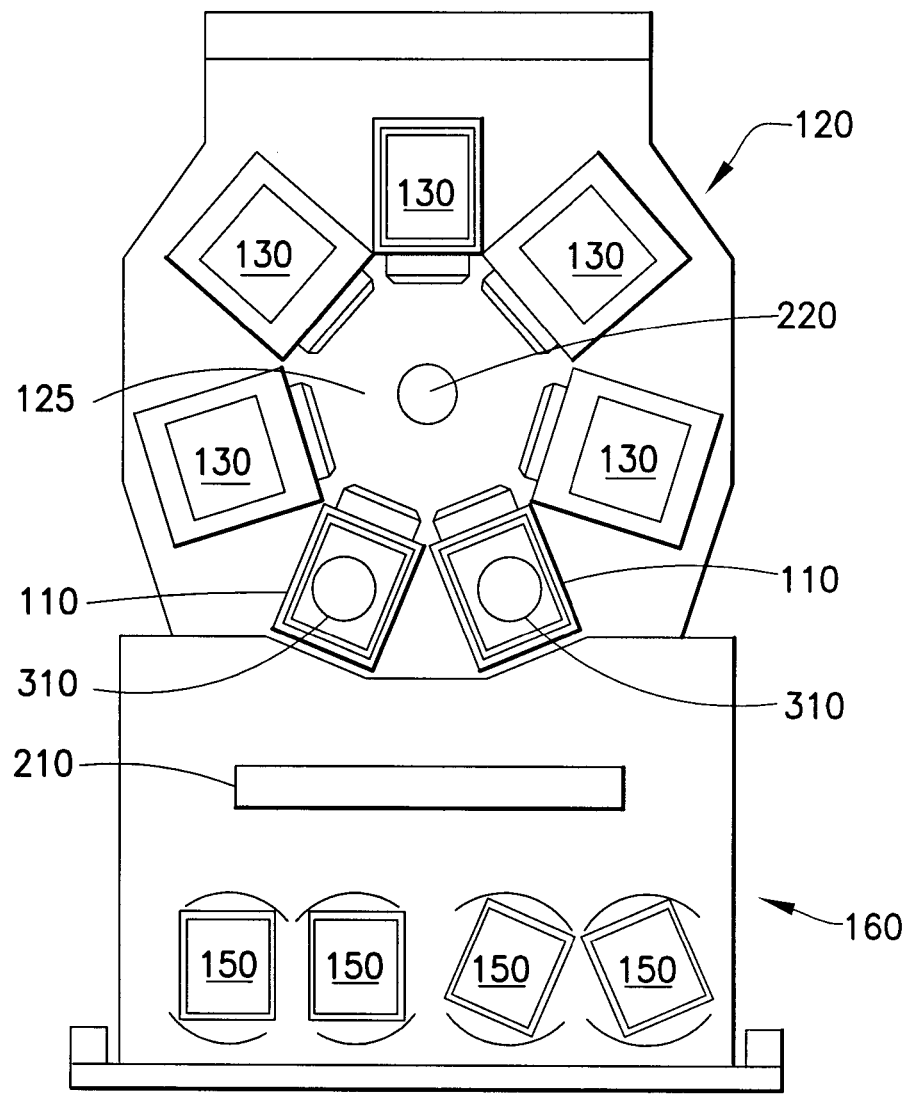

FIGS. 2A and 2B illustrate schematic views of a processing apparatus in accordance with an exemplary embodiment. Although the embodiments disclosed will be described with reference to the embodiments shown in the drawings, it should be understood that the embodiments disclosed can be embodied in many alternate forms of embodiments. In addition, any suitable size, shape or type of elements or materials could be used.

Referring to FIGS. 2A and 2B, a processing apparatus, such as for example a semiconductor tool station 190 is shown in accordance with an exemplary embodiment. Although a semiconductor tool is shown in the drawings, the embodiments described herein can be applied to any tool station or application employing robotic manipulators. In this example the tool 190 is shown as a cluster tool, however the exemplary embodiments may be applied to any suitable tool station such as, for example, a linear tool station. The tool station 190 generally includes an atmospheric front end 100, a vacuum load lock 110 and a vacuum back end 120. In alternate embodiments, the tool station may have any suitable configuration. The components of each of the front end 100, load lock 110 and back end 120 may be connected to a controller 200 which may be part of any suitable control architecture such as, for example, a clustered architecture control. The control system may be a closed loop controller having a master controller, cluster controllers and autonomous remote controllers. In alternate embodiments, any suitable controller may be utilized.

In the exemplary embodiments, the front end 100 generally includes load port modules 105 and a mini-environment 160 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In alternate embodiments, the load port modules may be configured as 200 mm wafer interfaces or any other suitable substrate interfaces such as for example larger or smaller wafers or flat panels for flat panel displays. Although two load port modules are shown in FIG. 2A, in alternate embodiments any suitable number of load port modules may be incorporated into the front end 100. The load port modules 105 may be configured to receive substrate carriers or cassettes 150 from an overhead transport system, automatic guided vehicles, person guided vehicles, rail guided vehicles or from any other suitable transport method. The load port modules 105 may interface with the mini-environment 160 through load ports 140. The load ports 140 may allow the passage of substrates between the substrate cassettes 150 and the mini-environment 160. The mini-environment 160 generally includes a transfer robot 210 as will be described in greater detail below. The mini-environment 160 may provide a controlled, clean zone for substrate transfer between multiple load port modules.

The vacuum load lock 110 may be located between and connected to the mini-environment 160 and the back end 120. The load lock 110 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 110 may also include an aligner 310 for aligning a fiducial of the substrate to a desired position for processing. In alternate embodiments, the vacuum load lock may be located in any suitable location of the processing apparatus and have any suitable configuration.

The vacuum back end 120 generally includes a transport chamber 125, one or more processing station(s) 130 and a transfer robot 220. The transfer robot 220 will be described below and may be located within the transport chamber 125 to transport substrates between the load lock 110 and the various processing stations 130. The processing stations 130 may operate on the substrates through various deposition, etching, or other types of processes to form electrical circuitry or other desired structure on the substrates. Typical processes include but are not limited to etching, chemical vapor deposition (CVD), physical vapor deposition (PVD), ion implantation, metrology, rapid thermal processing (RTP), and dry stripping. The processing stations 130 are connected to the transport chamber 125 to allow substrates to be passed from the transport chamber 125 to the processing stations 130 and vice versa.

Referring now to FIGS. 3A-C and 4A-C, a substrate transport in accordance with an exemplary embodiment will be described. The substrate transport may include a drive section, a coupling system 499, and arm assemblies or linkages 491L, 491R. In this example, the substrate transport is shown having two scara (selective compliant articulated robot arm) type arm assemblies, but in alternate embodiments the substrate transport may have any suitable configuration with any suitable number and/or configuration of arm assemblies. The coupling system 499 may include or define what is referred to here as a mechanical switch or a lost motion system, that will be described in further detail below, that enables one drive motor of the drive section to effect extension and retraction of more than one scara arm substantially independent of each other.

The drive section may be for example a coaxial drive assembly. In alternate embodiments, any suitable drive section may be employed such as for example a non-coaxial drive assembly or a magnetic drive assembly. The drive section may be housed within a housing of the substrate transport to prevent contamination or damage to the substrates from any particles that may been generated from the moving parts of the drive section. In this example, the coaxial drive assembly may have an inner and outer drive shaft. The coaxial drive may be substantially similar to, for example, that described in U.S. Pat. Nos. 5,720,590 and 6,485,250 and/or Patent Publication Number 2003/0223853, which are incorporated herein by reference in their entirety. The outer drive shaft may be connected to a housing of the substrate transport so that when the outer drive shaft is rotated the arms 491L, 491R of the substrate transport 300 are rotated about an axis of rotation of the outer drive shaft. As may be realized the inner drive shaft may also rotate in the same direction and at the same speed as the outer drive shaft to keep the arms of the transport 300 from extending or retracting as the substrate transport 300 is rotated. The inner drive shaft may be connected to the coupling system at rotation point 400 so that when the inner drive shaft is rotated the coupling system will rotate or pivot about an axis of rotation (i.e. rotation point 400) of the inner drive shaft as will be described below.

Figure 3A:
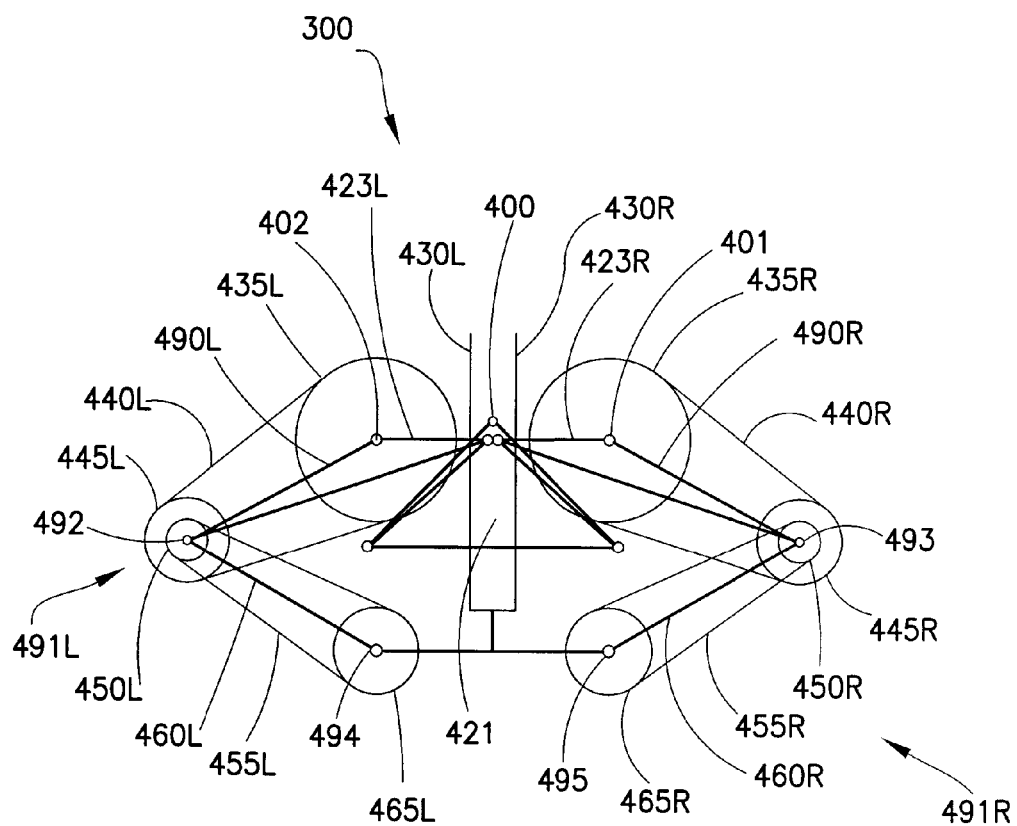
FIGS. 3A-C illustrate schematic views of a substrate transport apparatus incorporating features of an exemplary embodiment, the transport apparatus being respectively shown in three positions.

Referring to FIGS. 4A-C, in the exemplary embodiment the coupling system 499 may include substantially rigid coupling elements 421, 422L, 422R, 423L and 423R. Base element 421 will be referred to herein for convenience as a platform and elements 422L, 422R will be referred to herein as links (for example capable of pivoting about two longitudinally offset pivots). Elements 423L, 423R may be integral portions of the upper arms 490L, 490R respectively, or members rigidly depending from the upper arm. In alternate embodiments, elements 423L, 423R may be any suitable members having any suitable configuration for transferring motion to the upper arms 490L, 490R. In the exemplary embodiments, and for the ease of explanation, the elements 423L, 423R are substantially illustrated in FIGS. 3A-C and 4A-C as a pivotal link. The platform 421 in the embodiment illustrated in FIGS. 3A-C and 4A-C has an exemplary configuration. In alternate embodiments the platform element may have any desired shape. The links 422L, 422R in the exemplary embodiments may be movably joined by pivotally released joints as will be described further below. In alternate embodiments, the links may be joined to adjoining elements via any other desired movable joint (such as joints translatably released in addition to or in lieu of pivotally releasing of the joints). The coupling elements may have any suitable configuration and may be made of any suitable material such as a metal, plastic, ceramic, carbon fiber, composite, etc. that would allow the substrate transport 300 to operate in an atmospheric or vacuum environment and carry any suitable predetermined load. In this example, the platform 421 may be movably mounted to the drive section at revolute joint 400 and driven by for example the inner drive shaft. As seen best in FIG. 4A, link 422L may be pivotally connected to the platform 421 at revolute joint 403. The revolute joint may be configured to limit or minimize the amount of particulate generated to prevent contamination of the substrate that is transported by the transport 300. In alternate embodiments any suitable revolute joint or pivotal connection maybe utilized. Pivotal link 423L may be pivotally joined similar to the manner described above to link 422L at revolute joint 404. Again, the term link is used merely for convenience to refer to elements 423L, 423R as the elements may not be a link with respect to the upper arm as will be described below. Links 422R and 423R are pivotally connected to the platform and to each other through revolute joints 405 and 406 in a substantially similar manner as that described above with respect to links 422L and 423L. As can be seen in FIGS. 3A and 4A, the ends of the links 423L, 423R may be pivotally mounted to a fixed location through revolute joints 402, 401 (for example joints 402, 401 may be respectively configured so that the positional relationship with pivot 400 remains substantially constant). Revolute joints 402, 401 may be considered respectively the shoulder joints of the corresponding scara arms 491L, 491R respectively. The platform 421 may be rotated as shown in FIGS. 4A-4C and the revolute joints 404, 406 rotate around a respective one of the joints 402, 401 as will be described in greater detail below. The platform 421 and the links 422L, 422R, 423L and 423R form a pair of three bar mechanisms coupled through the pivoting platform 421.

As can be seen in FIG. 4A, when the platform 421 is in a neutral position (which as may be realized from FIG. 3A may correspond in the example to a position of both arms 491L, 491R being retracted), the links 423L, 423R may be considered to be in their initial positions. The geometry of the coupling elements 421, 422L, 422R, 423L, 423R may be selected so that rotation of the platform 421 from the neutral position in the clockwise direction produces a change of angular orientation of the link 423L while the link 423R is kept substantially stationary in the initial position and vice versa as can be seen in FIGS. 4B and 4C (i.e. a lost motion system). In this example, the coupling elements are configured so that about a ninety-degree rotation of the platform 421 in either a clockwise or counter-clockwise direction causes about a one hundred eighty-degree motion of the links 423L, 423R. The rotations of the linkages of coupling 499 are merely exemplary and in alternate embodiments the linkages may be arranged to provide and undergo any desired range of motions switching from driving one arm independent of the other.

In this exemplary embodiment, the angular orientation of the links 423L, 423R changes or rotates in the same direction of rotation as the platform 421 (e.g. a clockwise rotation of the platform causes a clockwise rotation of the links). In alternate embodiments, the coupling system can be configured so that the links 423L, 423R rotate in a direction opposite to the direction of rotation of the platform 421 (e.g. clockwise rotation of the platform causes a counter-clockwise rotation of the links). For example, the links 422L, 422R may be connected to the platform at a common revolute joint so that the links 423L, 423R rotate opposite to the rotational direction of the platform 421. In other alternate embodiments, the coupling system may have any suitable configuration for rotating the links 423L, 423R. In still other alternate embodiments, the coupling system may be configured so that the rotational motion of the links 423L, 423R is replaced with a translational or sliding motion or a combination of sliding and pivoting motion. The sliding motion may actuate the arms of the transport directly or be converted to rotational motion for actuation of the arms. In other alternate embodiments, the arms may be actuated in any suitable manner.

Referring again to FIGS. 3A-3C, in the exemplary embodiment the arms 491L, 491R of the transport 300 include an upper arm member 490L, 490R, a forearm member 460L, 460R and an end effector 430L, 430R connected to each other through respective revolute joints 492, 493, 494, 495. In alternate embodiments, the arms may have more or fewer articulations. Here the upper arms 490L, 490R pivot about revolute joints 402, 401 (e.g. shoulder joints). The proximate ends of the upper arms 490L, 490R are pivotally joined to the links 422L, 422R of the coupling system through revolute joints 404, 406 as previously described. The distal ends of the upper arms 490L, 490R may for example be pivotally joined to respective proximate ends of the forearms 460L, 460R at revolute joints 492, 493. In the exemplary embodiment, the distal ends of the forearms 460L, 460R may be pivotally joined to the end effectors 460L, 460R at revolute joints 494, 495. The end effectors 460L, 460R may have a longitudinal axis running from the front of the end effector to the back of the end effector. The longitudinal axis of the end effectors may be aligned with a path of extension and retraction P of the arms as will be described below. In alternate embodiments, the arms may have any desired configuration relative to the axis of extension/retraction P.

Figure 3C:
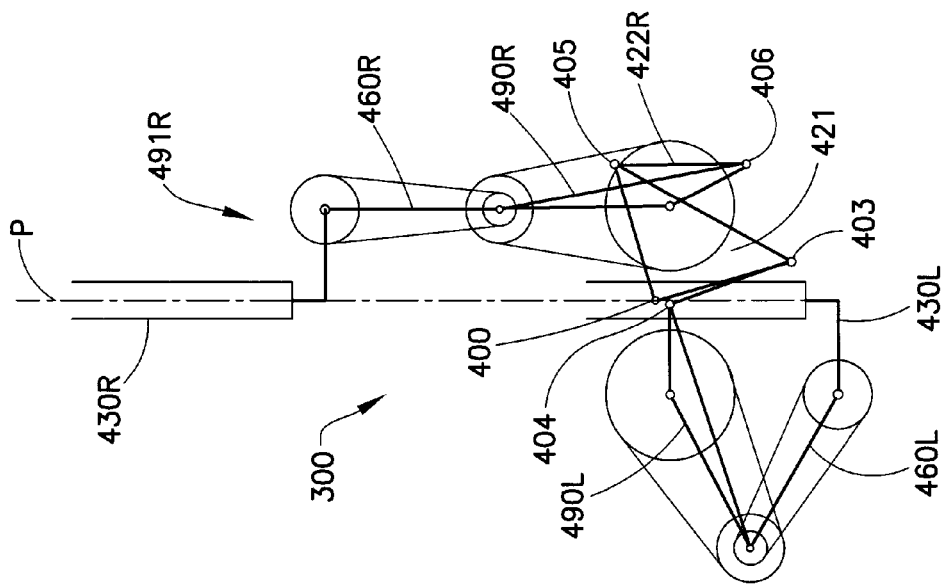
Figure 3B:
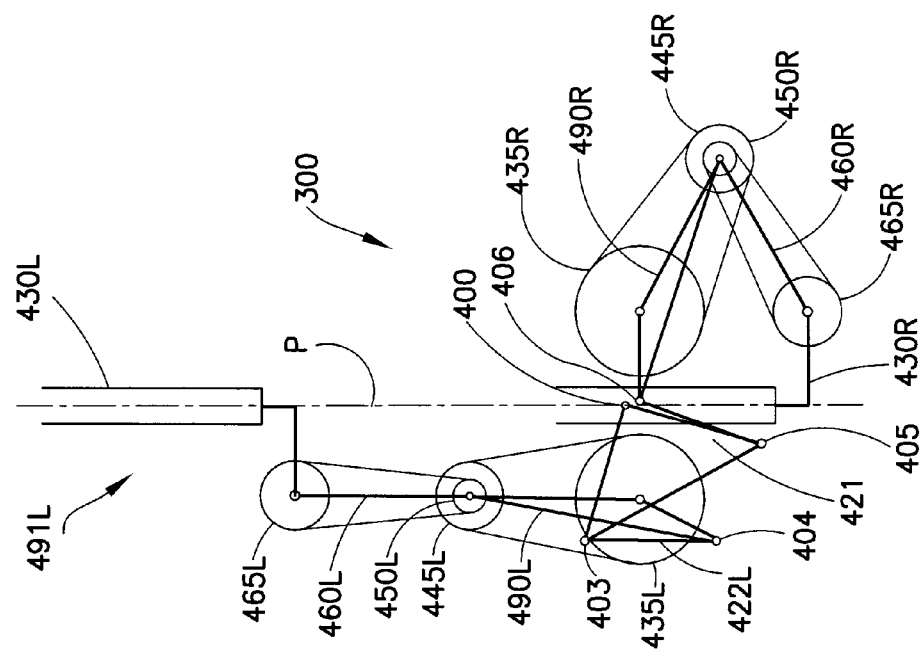

In this exemplary embodiment the links 423L, 423R of the coupling system may be incorporated into or are part of the upper arms 490L, 490R respectively so that links 423L, 423R form a portion or extension of their respective arm as previously described. In alternate embodiments, the arms may be configured to include the upper arm portions 423L, 423R in any suitable manner. As also noted before, the stationary revolute joints 402, 401 may be the pivot points of the upper arms 490L, 490R respectively. The shape of the upper arms 490L, 490R shown in the FIGS. 3A-3C is merely exemplary and in alternate embodiments, the upper arms may have any suitable shape such as, for example, the upper arms may be straight or have an "L" or curved shape. In other alternate embodiments, the upper arm portions 423L, 423R may be connected to a pulley or disk that is mounted to the upper arm so that as upper arm portions 423L, 423R are rotated around the points 402, 401 the respective disk rotates around point 402 or 401 thereby rotating a respective upper arm 491L, 491R. In still other alternate embodiments, the upper arm portions may depend from any portion of the arm for imparting torque to the upper arm. As may be realized, the relationship or orientation of the upper arm portions 423L, 423R to the rest of the upper arm as shown in FIGS. 3A-3C is merely exemplary and the upper arm portions 423L, 423R may have any suitable relationship/orientation to the upper arm.

Figure 5:
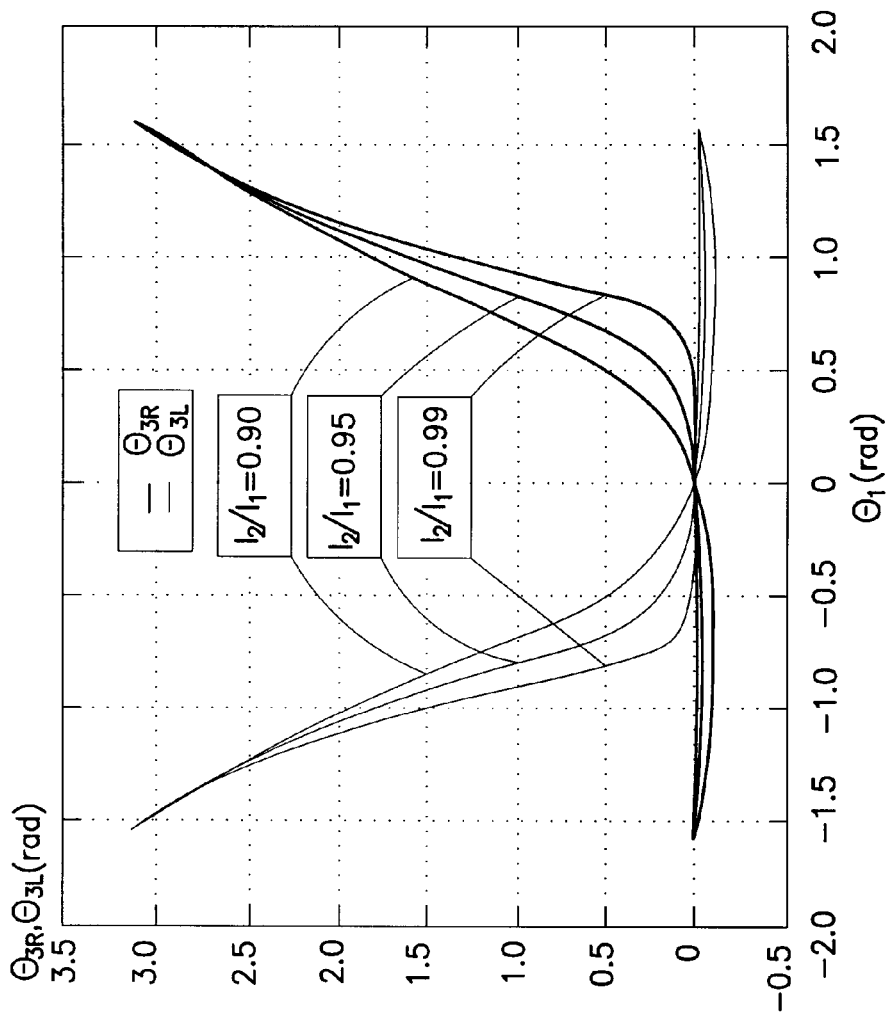
FIG. 5 illustrates a graphical representation of the motion of a substrate transport apparatus in accordance with an exemplary embodiment.

The angular orientations of the upper arm portions 423L, 423R as a function of the angular position of the platform 421 are graphed in FIG. 5. In FIG. 5, $\theta_1$ denotes the angular position of the platform 421 and $\theta_{3L}$, $O_{3R}$ are the angular orientations of the upper arm portions 432L, 432R respectively. The angular orientations $\theta_1$, $\theta_{3L}$ and $\theta_{3R}$ are measured in radians with respect to the initial position of the platform 421 as shown in FIG. 4A where the initial position of the platform 421 corresponds to zero radians. $\theta_1$ and $\theta_{3R}$ are positive in a counter-clockwise direction while $\theta_{3L}$ is positive in a clockwise direction. In this exemplary embodiment the coupling system is configured so that a ninety-degree rotation of the platform 421 produces a one hundred eighty-degree motion of the upper arm portion 423L, 423R subject to actuation. In alternate embodiments, any suitable range of motion can be achieved by selecting the dimensions of the coupling system components accordingly.

As can be seen in FIG. 5, as the platform 421 is rotated to actuate for example upper arm portion 423L there may be some minor residual motion of the stationary upper arm portion 423R. The amount of residual motion of the stationary upper arm portion 423R while the other upper arm portion 423L moves can be controlled by the ratio of $l_2$ over $l_1$ where $l_1$ is defined as the distance between the pivoting point 400 of the platform 421 and the revolute joints 403, 405 which couple the upper arm portions 423L, 423R to the platform 421. $l_2$ is defined as the length of the upper arm portions 422L, 422R. As shown in FIG. 5, the amount of residual motion of the stationary upper arm portion, which in this example is 423R, is reduced as the ratio $l_2/l_1$ approaches the value of one. Thus, as may be realized from FIG. 5, the coupling system provides a lost motion characteristic that mechanically switches the drive to generate substantially independent motion (e.g. extension/retraction from a common drive motor or drive shaft).

The arms 491L, 491R may also include a belt and pulley system for driving the forearm. For example, pulleys 435L, 435R may be coupled to a stationary fixture or hub at joints 402, 401 so that as the upper arms rotate, their respective pulleys 435L, 435R remain stationary relative to the apparatus frame (e.g. upper arm motion effects relative movement between upper arm and corresponding pulley). A second (idler) pulley 450L, 450R may be coupled to the forearms 460L, 460R about joints 492, 493. The pulleys 435L, 450L and 435R, 450R may be connected by any suitable belt or bands 440L, 440R so that as the upper arms rotate 490L, 490R, relative motion with pulleys 435L, 435R, the pulleys 445L, 445R to be drivingly rotated via the belts. In alternate embodiments, the pulleys may be connected by one or more metal bands that may be pinned or otherwise fixed to the pulleys. In other alternate embodiments, any suitable flexible band may connect the pulleys. In still other alternate embodiments, the pulleys may be connected in any suitable manner or any other suitable transmission system may be used. The pulleys 435L, 435R, 450L, 450R may be configured so that the movement of the arm members is constrained so that rotation of the upper arms 490L, 490R about joints 402, 401 produces desired rotation of a respective one of the forearms 460L, 460R in the opposite direction. For example, to achieve this rotational relationship the ratio of the radii for pulleys 450L, 450R to pulleys 445L, 445R may be a 2:1 ratio.

In the exemplary embodiment, a second belt and pulley arrangement including pulleys 445L, 445R, 465L, 465R and belts 455L, 455R may be provided to drive the end effectors 430L, 430R so that the radial orientation or longitudinal axis of the end effectors 430L, 430R along the common path of travel P is maintained as the arms 491L, 491R are extended and retracted. The pulleys 445L, 445R may be coupled to their respective upper arm 490L, 490R about joints 492, 493 and the pulleys 465L, 465R may be coupled to their respective end effectors 430L, 430R about joints 494, 495. In this example the ratio of pulleys 445L, 445R to pulleys 465L, 465R may be a 1:2 ratio. As can be seen in FIGS. 3A-C pulleys, in the exemplary embodiment 450L, 450R are mounted in line with a respective one of the pulleys 445L, 445R about joints 492, 493 so that when the pulleys 450L, 450R are rotated with the forearms 460L, 460R the pulleys 445L, 445R remain stationary with respect to their respective upper arms 490L, 490R. Any suitable belt 455L, 455R may connect a respective pair of the pulleys so that as the forearms 460L, 460R are rotated the pulleys 465L, 465R are drivingly rotated. In alternate embodiments, the pulleys may be connected by one or more metal bands that may be pinned or otherwise fixed to the pulleys. In other alternate embodiments, any suitable flexible band may connect the pulleys. In still other alternate embodiments, the pulleys may be connected in any suitable manner.

The end effectors 430L, 430R may be coupled to a respective forearm at revolute joint 494, 495. The end effectors 430L, 430R may be drivingly coupled to a respective one of the pulleys 465L, 465R so that as the arms are extended or retracted the end effectors 430L, 430R stay longitudinally aligned with the common path of travel P as can be seen in FIGS. 3B, 3C. It may be realized that the belt and pulley systems described herein may be housed within the arm assemblies 491L, 491R so that any particles generated may be contained within the arm assemblies. A suitable ventilation/vacuum system may also be employed within the arm assemblies to further prevent particles from contaminating the substrates. In alternate embodiments, the synchronization systems may be located outside of the arm assemblies. In other alternate embodiments, the synchronization systems may be in any suitable location.

Still referring to FIGS. 3A-C the operation of the substrate transport 300 will now be described with respect to arm 491L. As can be seen in FIG. 3A the substrate transport 300 is at its initial or neutral position with both arms 491L, 491R in a retracted position. The coupling system and a portion of the arms may be located within a housing suitably configured to prevent particles generated by moving parts of the substrate transport from contaminating the substrates. For example slots may be provided in the housing for the arms to pass where any openings between the slots and the arms are sealed with a flexible seal. In alternate embodiments, the housing may have any suitable configuration to prevent substrate contamination from particulates that may be generated from moving parts of the transport. In other alternate embodiments, the coupling system may not be within a housing.

To extend the arm 491L the platform 421 is rotated via the drive system in a clockwise direction about the revolute joint 400. Rotation of the platform 421 causes a change in angular orientation of the link 422L which in turn causes the link 423L and the upper arm 490L to rotate about the stationary revolute joint 402. Rotation of the upper arm 490L in turn causes stationary pulley 435L to drive pulley 445L via belt 440L so that as the arm is extended the forearm 460L is rotated an equal amount in the opposite direction about revolute joint 492. Rotation of the forearm 460L in turn causes pulley 450L to drive pulley 465L via belt 455L so that the radial orientation or longitudinal axis of the end effector 430L is maintained along the path of travel P as the arm is extended. Thus, the rotation of the forearm 460L is slaved to the rotation of the upper arm 490L about point 402 and the rotation of the end effector 430L is slaved to the rotation of the forearm 460L about point 492. As a result the arm 491L is extended radially with respect to the pivot point 400 of the platform 421 while the arm 491R remains substantially stationary in its retracted position. Retraction of the arm 491L occurs in a substantially opposite manner. The extension of the arm 491R is substantially similar to that described above with respect to arm 491L except that to extend arm 491R the platform is rotated in a counter-clockwise direction. As may be realized, because the end effectors 430L, 430R travel along a common path of travel P, the end effectors may be configured in such a way so as to be in different planes along the path of travel P. In alternate embodiments, the arms 491L, 491R may be configured to be at different heights so that the end effectors can travel along the common path P. In other alternate embodiments the end effectors and arms may have any suitable configuration to allow the end effectors to travel along a common path of travel in the same direction. In still other alternate embodiments the scara arms and switching linkage may be arranged to generate independent travel of the end effectors in different directions such as opposing directions or directions oriented at an angle with respect to each other.

Because of the coupling system 499, the rotation of the upper arms 490L, 490R about joints 402, 401 is variable with respect to the rotation of the corresponding drive shaft of the drive system over the extension and retraction of each of the arms 491L, 491R. The controller 200 may be configured through suitable algorithms so that the arms 491L, 491R maintain a substantially steady state motion during extension and retraction. For example, the controller may cause the drive system for the platform 421 to cause rotation at different speeds according to the extended or retracted position of the arm at any given time so that the extension and retraction of the arm is a substantially uniform motion. In alternate embodiments, the motion of the arm may be controlled in any suitable manner. Sensors or encoders for detecting and tracking the extension and retraction of the arms may be located at any suitable point along the arms 491L, 491R such as for example a sensor at joint 400 (which as may be realized may suffice as a common sensor to sense and control motion of both independently movable arms 491L, 491R), or in alternate embodiments at the revolute joints 402, 401, 492 and/or 493. Any suitable number or type of sensors may be utilized. For example, the sensors may be wireless sensors or wired sensors. Feedback from the sensor may be used by the controller 200 for adjusting the rotational speed of the drive shafts.

Referring now to FIGS. 6-8 a substrate transport 700 is shown in accordance with another exemplary embodiment. In this exemplary embodiment the substrate transport 700 operates such that the arms 650L, 650R may be actuated through a rocking motion of a portion of the drive section as will be described in greater detail below. The substrate transport 700 may include a drive section, a coupling system 800, and arm assemblies or linkages 650L, 650R. The arm assemblies 650L, 650R are substantially similar to the arm assemblies 491L and 491R respectively, unless otherwise noted and similar features are similarly numbered. In this example, the substrate transport is shown having two arm assemblies, but in alternate embodiments the substrate transport may have any suitable configuration with any suitable number of arm assemblies. The coupling system 800 may include or define what is referred to here as a mechanical switch or lost motion system that will be described in further detail below, that enables one or common drive motor of the drive section to effect extension and retraction of more than one scara arm substantially independent of each other.

The coupling system in the exemplary embodiment, as shown in FIGS. 7A-F and 8A-E, may include substantially rigid coupling elements 731, 730L, 730R, 732L, 732R, 733L and 733R. Base element 731 will be referred to herein for convenience as a platform and coupling elements 730L, 730R, 732L and 732R will be referred to herein for convenience as links although the elements 730L, 730R, 732L, 732R may not be links but may have any suitable configuration for behaving as links. Elements 733L, 733R may be integral portions of the upper arms 610L, 610R respectively, or members rigidly depending from the upper arm and will be referred to herein for convenience as upper arm portions. In alternate embodiments, upper arm portions 733L, 733R may be any suitable members having any suitable configuration for transferring motion to the upper arms 610L, 610R. In the exemplary embodiments, and for the ease of explanation, the upper arm portions 733L, 733R are substantially illustrated in FIGS. 7E-F and 8A-E as a pivotal link.

The platform 731 in the embodiment illustrated in FIGS. 6A-C, 7A-F and 8A-E has an exemplary configuration. In alternate embodiments the platform element may have any desired shape. The links 732L, 732R in the exemplary embodiments may be movably joined by pivotally released joints as will be described further below. In alternate embodiments, the links may be joined to adjoining elements via any other desired movable joint (such as joints translatably released in addition to or in lieu of pivotally releasing of the joints). The coupling elements may be made of any suitable material such as a metal, plastic, ceramic, carbon fiber, composite, etc. that would allow the substrate transport 300 to operate in an atmospheric or vacuum environment and carry any suitable predetermined load.

As will be described below, links 730L and 730R may correspond to drive elements 1060 and 1050 respectively as shown in FIG. 11. As can be seen best in FIGS. 7A-B and 7E, the links 730L, 730R may be pivotally coupled to the platform 731 at revolute joints B and A respectively. In this exemplary embodiment, the length of the links 730L, 730R is substantially equal to the distance between revolute joints A and B. In alternate embodiments the links may have any suitable length. The other ends of the links 730L, 730R may be pivotally coupled to stationary (relative a hub of the arm assembly) revolute joints C and D respectively. In this exemplary embodiment, the distance between joints C and D is substantially equal to the length of the links 730L, 730R. In alternate embodiments, the distance between joints C and D may be any suitable distance. When the platform is in, what may be referred to for example, a neutral position the revolute joints A and C may be substantially in line with each other while revolute joints B and D are substantially in line (e.g. having a substantially common axis of rotation, with each other as can be seen in FIGS. 7B and 7E.

Figure 6A:
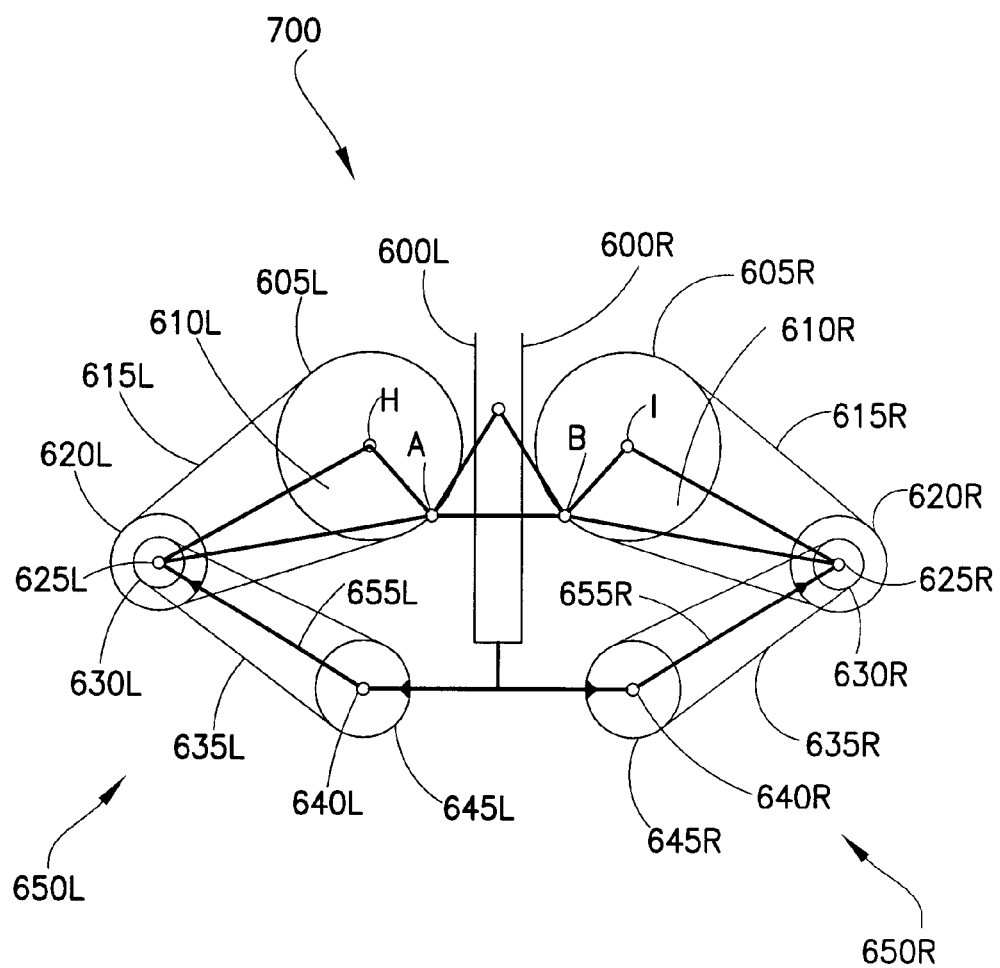
FIGS. 6A-C illustrate schematic views of a substrate transport apparatus incorporating features of an exemplary embodiment, the transport apparatus being respectively shown in three positions.
Figure 7E:
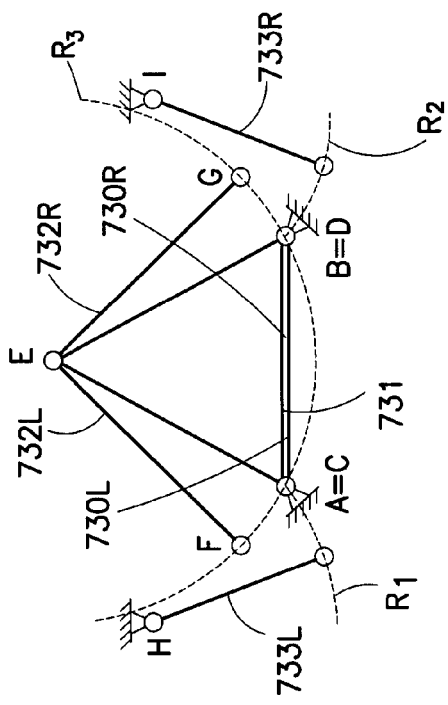
FIGS. 7E-7F are schematic views of another representative portion of the transport apparatus respectively illustrating different positions.
Figure 7F:
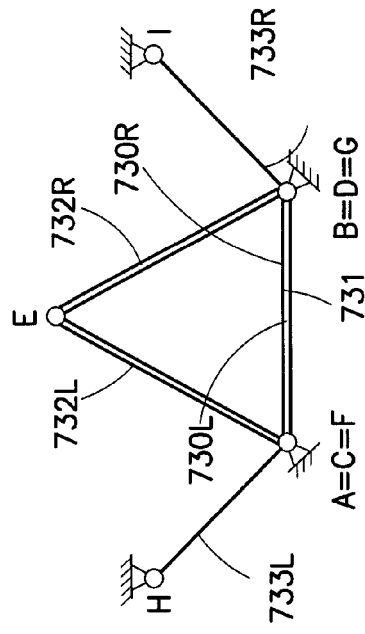
Figure 7B:
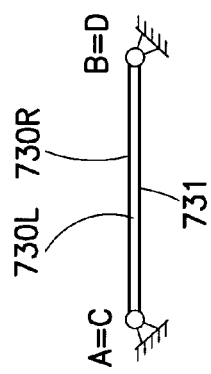
FIGS. 7A-D illustrate schematic views of a representative portion of the substrate transport apparatus in FIGS. 6A-6C, respectively shown in different positions
Figure 7D:
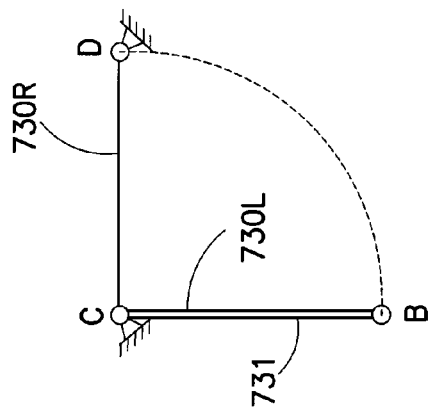
Figure 7A:
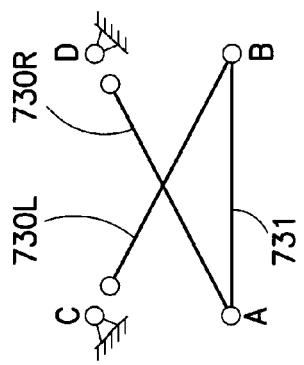
Figure 7C:
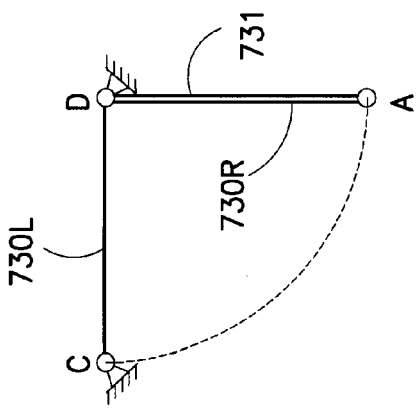

The platform 731 may also include revolute joint E as can be seen in FIGS. 7E and 7F. One end of the links 732L, 732R is pivotally connected to the platform at joint E. In this exemplary embodiment, the length of the links 732L, 732R are substantially equal to the distances between joints A and E and joints B and E respectively. The other ends of links 732L, 732R are pivotally connected to one end of the upper arm portions 733L, 733R about revolute joints F and G. The other ends of the upper arm portions 733L, 733R are pivotally connected to stationary (relative to a hub of the arm assembly) revolute joints or pivots H and I. In this exemplary embodiment, the dimensions of upper arm portions 733L, 733R and the locations of the stationary pivots H, I are selected so that the rotational trajectories R1, R2 of joints F and G pass through points C and D respectively (see FIG. 7E). This exemplary configuration may constrain motion of joints A, B as the platform 731 is rotated as will be described below in greater detail. In alternate embodiments, the upper arm portions 733L, 733R may have any suitable dimensions and the stationary pivots H, I may be located in any suitable location. As can be seen in FIG. 7F, when the coupling system is in a neutral position the revolute joints A, C, F are substantially inline with each other and the revolute joints B, D, G are substantially in line with each other. When the coupling system is in its neutral position the arms of the substrate transport are also in a retracted position as shown in FIG. 6A. The illustrated motions of the linkages of the coupling system are merely exemplary and in alternate embodiments the linkages may be arranged to provide and undergo any desired range of motion switching from driving the arms independently of each other.

Figure 8A:
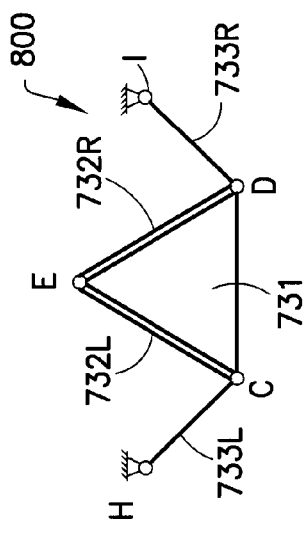
FIGS. 8A-E illustrate schematic views of a portion of the substrate transport apparatus in FIGS. 6A-6C, respectively shown in five different positions.
Figure 8D:
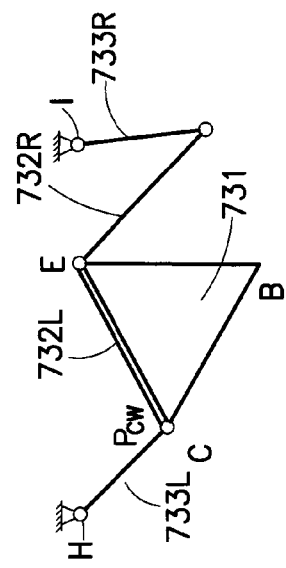
Figure 8E:
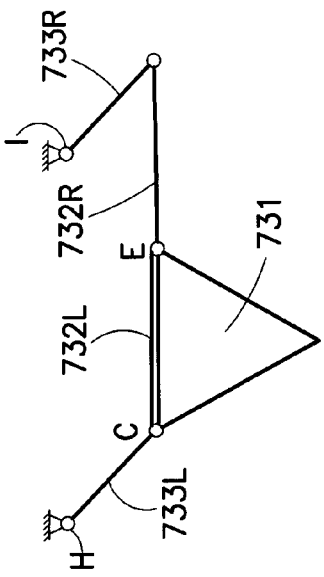
Figure 9:
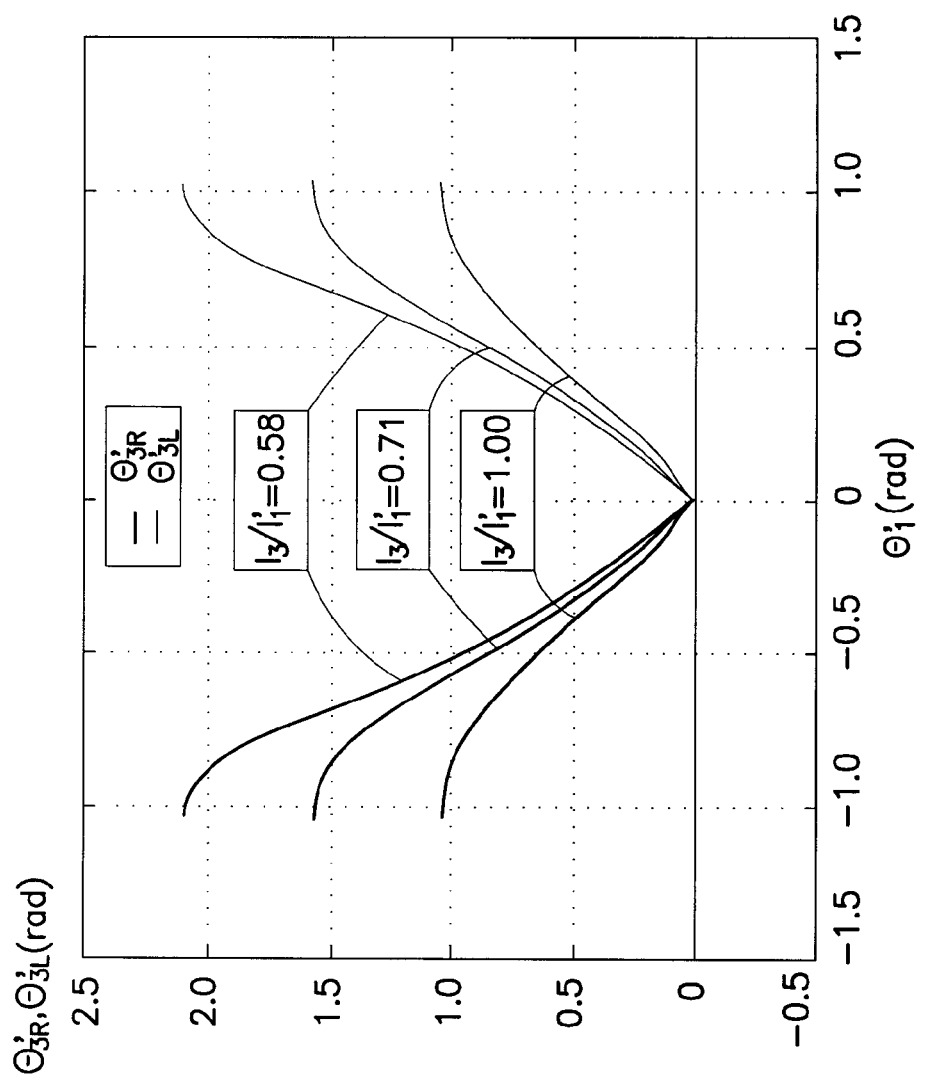
FIG. 9 illustrates a graphical representation of the motion of a substrate transport apparatus in accordance with an exemplary embodiment.

The angular orientations of the elements 733L, 733R as functions of the angular position of the platform 731 are graphed in FIG. 9. In FIG. 9, $\theta_1'$ denotes the angular position of the platform 731 and $\theta_{3L}'$, $O_{3R}'$ are the angular orientations of the elements 733L, 733R respectively. The angular orientations $\theta_1'$, $\theta_{3L}'$ and $O_{3R}'$ are measured in radians with respect to the initial position of the platform 731 as shown in FIG. 8A where the initial position of the platform 731 corresponds to zero radians. $\theta_1'$ and $\theta_{3R}'$ are positive in a counter-clockwise direction while $\theta_{3L}'$ is positive in a clockwise direction. The range of motion of the platform 731 can be controlled through the ratio of $l_3$ over $l_1'$ where $l_1'$ is defined as the distance between the pivoting points C, D of the platform 731 and the revolute joint E which couples the links 732L, 732R to the platform 731. Reference $l_3$ is defined as the length of the links 732L, 732R. As shown in FIG. 9, there is substantially no residual motion of the stationary link with rotation of the coupling system 800.

Referring now to FIGS. 11A-11E, an exemplary embodiment of a drive section for the substrate transport will be described. The drive section may be any suitable drive section such as, for example, a magnetic drive assembly, a coaxial drive assembly, a non-coaxial drive assembly or a combination thereof. The drive section shown in FIGS. 11A-11E may include a first drive shaft 1190 for changing the direction (e.g. angular orientation) of the transport robot and a second drive shaft 1120 for driving rotational elements 1150, 1160 (e.g. effecting extension/retraction of the arms independent from each other). As described above, rotational elements 1150, 1160 may correspond to links 730R and 730L respectively. Again, even though the rotational elements 1150, 1160 correspond to links 730R, 730L these elements may merely behave as a link that is released or otherwise capable of allowing rotation of member 731 at an end opposite its axis of rotation as will be described below. In alternate embodiments the elements 1150, 1160 may have any suitable configuration. The drive section may also include a coupling system 800 having a platform 731 as described above. The drive section can apply torque to the platform 731 to cause the platform to pivot about point D in a counterclockwise direction from the neutral position and about point C in a clockwise direction from the neutral position (e.g. rocking motion about joints C and D).

In this exemplary embodiment, the first drive shaft 1190 may be coupled to a housing, such as housing 1100 of the substrate transport so that when the first drive shaft 1190 is rotated the arm assemblies 650L, 650R are rotated about the axis X of the drive shaft 1190. The second drive shaft may be driven in any suitable manner such as through, for example, a separately mounted motor that is configured to stay in line with the drive shaft 1120 or through a transmission system (e.g. pulley system) that is driven by a drive shaft that is coaxial with drive shaft 1190. Although the second drive shaft 1120 is shown along axis C in the figures, in alternate embodiments the location of the second drive shaft 1120 may be reversed with the shaft 1140. In other alternate embodiments the second drive shaft may be located in any suitable location.

Figure 11A:
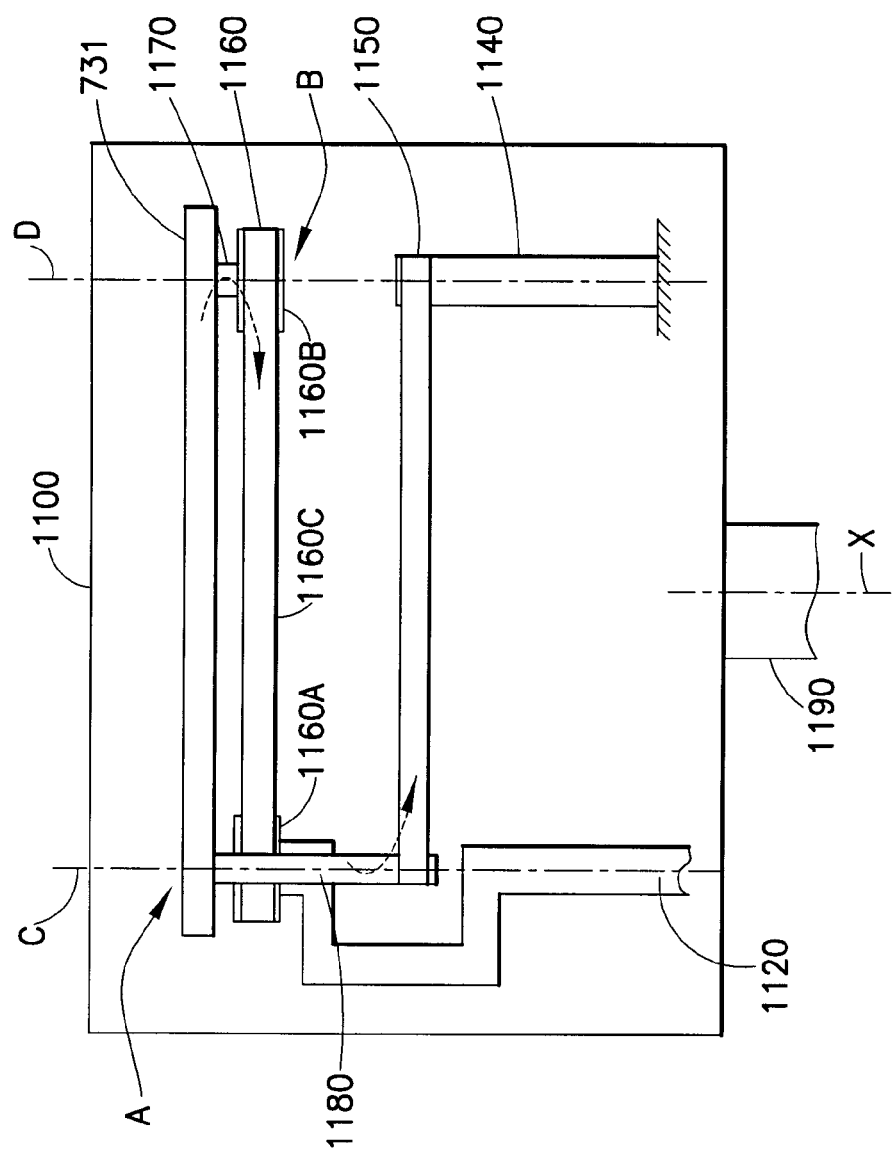
FIG. 11A illustrates a schematic view of a portion of the substrate transport apparatus in FIGS. 6A-6C in accordance with an exemplary embodiment.

Drive shaft 1120 may be fixedly coupled to rotational element 1160 so that drive shaft 1120 rotates element 1160. In this exemplary embodiment, as can be seen in FIG. 11A, the drive shaft 1120 is shown as having a torque transfer arm so that the drive shaft does not interfere with the element 1150. In alternate embodiments, the drive shaft 1120 and element 1150 may have any suitable configuration.

In this exemplary embodiment, element 1160 includes a first and second pulley 1160A, 1160B and a drive belt 1160C. The drive belt may be any suitable belt such as for example a metal band that is pinned or otherwise fixed to the pulleys. The belt 1160C may have a suitable cross section so that element 1160 acts as a substantially rigid member that is able to carry a cantilever load such as, for example the platform 731. In alternate embodiments, the element 1160 may be a bar, shaft or have any other suitable configuration for rotating the platform 731.

The element 1160 may be coupled to an engagement member 1170 of platform 731 so that as the pulley 1160A is rotated about axis C the platform 731 may be also rotated about axis D as will be described below. The engagement member 1170 may be coupled to the element 1160 at, for example, the pulley 1160B. The engagement member may be any suitable engagement member. The engagement member 1170 may be substantially along axis D and suitably configured to support platform 731 in conjunction with element 1160 and shaft 1120. In alternate embodiments the drive section may have any suitable configuration for causing the operation of the substrate transport as described herein.

The shaft 1140 may be for example rotatably mounted about axis of rotation D and suitably supported so that shaft 1140 rotates about axis D without any eccentricity or wobble. In alternate embodiments the shaft may not be rotatable. Shaft 1140 may be fixedly coupled to rotational element 1150 so that as rotational element 1150 rotates the shaft 1140 also rotates. In this example, element 1150 may be a band(s) that is pinned at one end to shaft 1140 and pinned at the other end to member 1180. In alternate embodiments where the shaft 1140 is not rotatable the band(s) 1150 may wrap around the shaft 1140 as the platform is rotated. In alternate embodiments the element 1150 may be coupled to the shaft 1140 and member 1180 in any suitable manner. The element 1150 may have a suitable cross section so that element 1150 acts as a substantially rigid member that is able to carry a cantilever load such as, for example the platform 731. In alternate embodiments, the element 1150 may be a bar, shaft or have any other suitable configuration for rotating the platform 731. The element 1150 may be coupled to an engagement member 1180 of platform 731, as described above, substantially along axis C so that as the platform 731 is rotated about axis D the element 1150 is also rotated about axis D as will be described below. Engagement member 1180 may be rotatably coupled to the platform 731 about axis C and suitably configured to avoid interference with element 1160 and shaft 1120. In alternate embodiments the engagement member 1180 may be fixed to the platform 731 so that as the platform rotates the band 1150 wraps around the member 1180. The engagement member may also be configured to support the platform 731 in conjunction with element 1150 and shaft 1140. As may be realized the elements 1150, 1160 may have a suitable configuration to avoid any interference between the elements 1150, 1160 and the drive shafts and engagement members. As may be realized, the drive section shown in FIGS. 11A-E is merely exemplary and the drive section may have any suitable configuration.

Figure 6C:
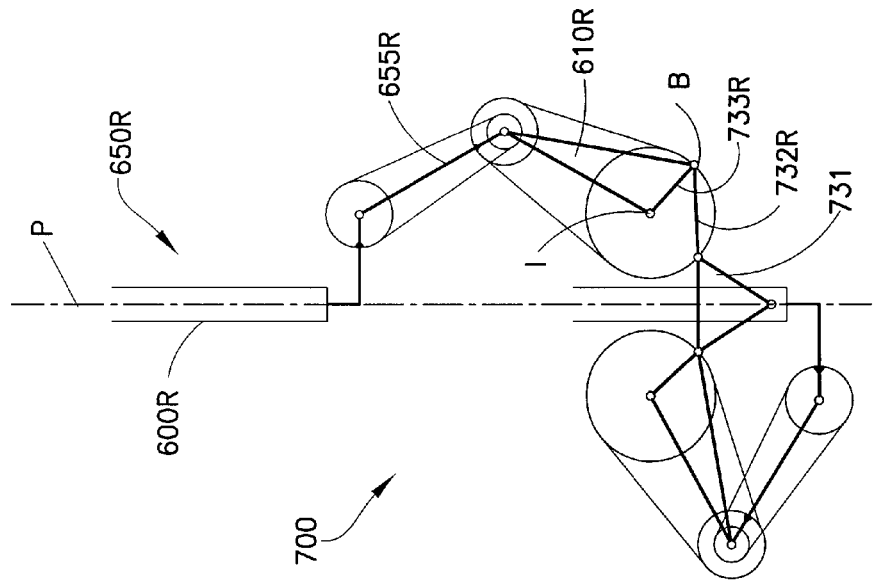
Figure 6B:
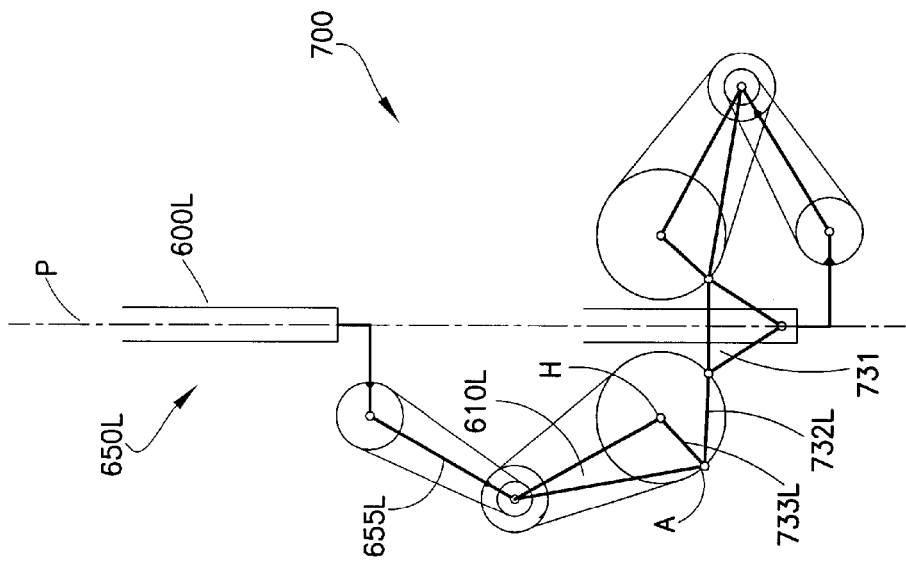

Referring to FIGS. 6A-C, 8A-E and 11A-E the operation of the substrate transport will be described. As noted above upper arm portion 733L forms a portion of the left arm 650L so that the left arm pivots around point H. Similarly, upper arm portion 733R forms a portion of the right arm 650R so that the right arm pivots around point I. The coupling system 800 and the arm assemblies are shown in their neutral positions in FIG. 8A and 6A. The upper arm shape shown in FIGS. 6A-6C is merely exemplary and the upper arm can have any other suitable shape such as, for example, the upper arms may be straight or have an "L" or curved shape. In other alternate embodiments, the upper arm portions 733L, 733R may be connected to a pulley or disk that is mounted to the upper arm so that as upper arm portions 733L, 733R are rotated around the points H, I the respective disk rotates around point H or I thereby rotating a respective upper arm 650L, 650R. In still other alternate embodiments, the upper arm portions may depend from any portion of the arm for imparting torque to the upper arm. As may be realized, the relationship or orientation of the upper arm portions 733L, 733R to the rest of the upper arm as shown in FIGS. 6A-6C is merely exemplary and the upper arm portions 733L, 733R may have any suitable relationship/orientation to the upper arm.

Operation of the left arm will now be described with respect to the drive shown in FIGS. 11A-E. To extend the left arm 650L from the neutral or retracted position the platform 731 rotates in a counter-clockwise direction about axis or point D as shown in FIGS. 6B, 11D and 8B-C. During rotation in the counter-clockwise direction the platform 731 may be supported at a number of locations. For example, the platform 731 may be supported directly about point D through element 1060 and any suitable coupled support, such as for example a shaft or as shown in FIG. 11A, by engagement member 1170 and drive shaft 1120A. The platform may be supported indirectly through links 733L, 732L at point H and through links 733R, 732R at point I. The platform may also be supported about point A via the member 1180, element 1150 and shaft 1140. In alternate embodiments, the platform 731 may be supported by more or less than three points.

To effect rotation of the platform 731 in the counter-clockwise direction about axis D, the shaft 1120 may be rotated in a counter-clockwise direction to impart torque on pulley 1160A. That torque is translated to pulley 1160B via the band(s) 1160C. Pulley 1160B transfers the torque to platform 731 via the engagement member 1170 so that platform 731 is rotated about axis or point D in a counter-clockwise direction. As may be realized, the coupling system is constrained so that counter-clockwise rotation of drive shaft 1120, and hence application of counter-clockwise torque on platform 731 results in pivoting of the platform about axis D. As platform 731 is rotated it may be supported at point A via the engagement member 1180 and the rotational member 1150. As can be seen best in FIG. 11D rotational member 1150 rotates about point D with the platform 731 in the counter-clockwise direction.

Figure 8B:
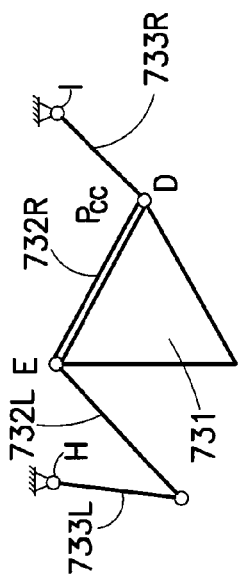
Figure 8C:
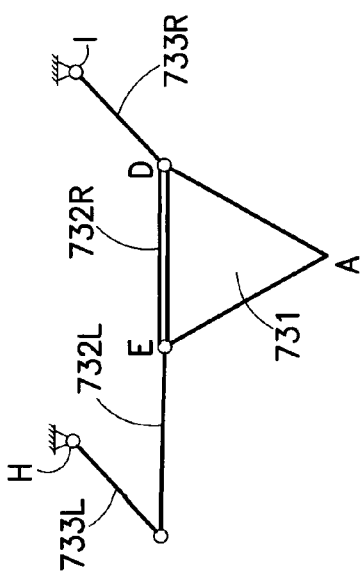

Point B of the platform 731, which is in line (in the initial position shown in FIGS. 7B, 7E-7F) with point D may be translationally constrained so that point B stays in line with point C during the counter-clockwise rotation of the platform 731. In this exemplary embodiment, when counter-clockwise torque is applied to point B, point B is constrained because of the relationship between the links 732R, 733R and joints I, D and E. As can be best seen in FIG. 7E, in the exemplary embodiment joint G may be allowed to pass along rotational paths R2, R3 while joint F may be allowed to pass along rotational paths R1, R3. As the platform is rotated the angular orientation of links 732L, 733L changes so that links 732L, 733L rotate about joints E and H respectively so that revolute joint F is rotated about point H along path R1 as can be seen in FIGS. 8B-C. As link 733L is part of the upper arm 610L of arm 650L the upper arm is caused to rotate about point H. In alternate embodiments, the link 733L may be drivingly connected to a shaft at point H for rotating the upper arm 610L. In other alternate embodiments, the link 733L may cause the rotation of the upper arm in any suitable manner. It is noted that as the platform 731 is rotated in a counter-clockwise direction the link 733L rotates in a clockwise direction while the link 733R remains stationary (i.e. revolute joint G stays in line with pivot D) so that the arm 650R does not move creating a lost motion system.

Rotation of the upper arm 610L causes stationary pulley 605L to drive pulley 630L via belt 615L so that as the arm is extended the forearm 655L is rotated an equal amount in the opposite direction about revolute joint 625L. Rotation of the forearm 655L in turn causes pulley 620L to drive pulley 645L via belt 635L so that the end effector rotates about point 640L. Rotation of the end effector about point 640L is such that the radial orientation or longitudinal axis of the end effector 600L is maintained along the common path of travel P as the arm 650L is extended and retracted. Thus, as described above with respect to FIGS. 3A-C, the rotation of the forearm 655L is slaved to the rotation of the upper arm 610L about point H and the rotation of the end effector 600L is slaved to the rotation of the forearm 655L about point 625L. As a result the arm 650L is extended radially while the arm 650R remains substantially stationary in its retracted position. Retraction of the arm 650L occurs in a substantially opposite manner.

To extend the right arm 650R from the neutral or retracted position the platform 731 rotates in a clockwise direction about point C as shown in FIGS. 6C, 11E and 8D-E. During rotation in the clockwise direction the platform may be supported at a number of locations. For example, it may be supported directly about point C through element 1150 and any suitable coupled support, such as for example a shaft or as shown in FIG. 11A, by engagement member 1180 and shaft 1140 and. The platform is supported indirectly through links 733L, 732L at point H and through links 733R, 732R at point I. The platform may also be supported by member 1170, element 1160 and shaft 1120. In alternate embodiments the platform may be supported by more or less than three points.

To effect rotation of the platform 731 in the clockwise direction, the shaft 1120 is rotated in a clockwise direction to impart clockwise torque on pulley 1160A. That torque is translated to pulley 1160B via the band(s) 1160C. Pulley 1160B transfers the clockwise torque to platform 731 via the engagement member 1170, and due to constraints platform 731 is rotated about axis or point C in a clockwise direction. In this exemplary embodiment, and platform 731 point C may be translationally constrained from moving past the neutral orientation when a clockwise torque is applied by shaft 1120, because of the relationship between links 733L, 732L and joints H, F and E. As can best be seen in FIG. 7E, joint F is allowed to pass along rotational paths R1, R3 while point G is allowed to pass along rotational paths R2, R3. As clockwise torque is applied to point B of the platform via the engagement member 1170, point F is not able to pass along either path R1 or R3 (i.e. constraining point A) which forces point G to pass along path R2. Again, point A is supported via the member 1180, rotational element 1150 and shaft 1140.

As the platform is rotated the angular orientation of links 732R, 733R changes so that links 732R, 733R rotate about points E and I respectively so that revolute joint G is rotated about point I. As link 733R is part of the upper arm 610R of arm 650R the upper arm is caused to rotate about point I. In alternate embodiments, the link 733R may be drivingly connected a shaft at point I for rotating the upper arm 610R. In other alternate embodiments, the link 733R may cause the rotation of the upper arm in any suitable manner.

In the exemplary embodiment, as the platform 731 is rotated in a clockwise direction the link 733R may be rotated in a counter-clockwise direction while the link 733L remains stationary (i.e. revolute joint F stays in line with pivot C) so that the arm 750L does not move. In alternate embodiments, the coupling system can be configured so that the links 733R, 733L rotate in the same direction as the platform such as by, for example, coupling the links 732L, 732R to the platform 731 in a non-collocated manner. In other alternate embodiments the coupling system may be configured so that the rotational movement of the links 733L, 733R is replaced with a sliding motion that can be used directly to rotate the upper arm or converted to rotational motion for rotating the upper arm. In still other alternate embodiments, the upper arm can be rotated in any suitable manner.

Rotation of the upper arm 610R causes stationary pulley 605R to drive pulley 630R via belt 615R so that as the arm is extended the forearm 655R is rotated an equal amount in the opposite direction about revolute joint 625R. Rotation of the forearm 655R in turn causes pulley 620R to drive pulley 645R via belt 635R so that the end effector 600R rotates about point 640R. Rotation of the end effector 600R about point 640R is such that the radial orientation or longitudinal axis of the end effector 600R is maintained along the common path of travel P as the arm 650R is extended and retracted. Thus, as described above with respect to arm 650L, the rotation of the forearm 655R is slaved to the rotation of the upper arm 610R about point I and the rotation of the end effector 600R is slaved to the rotation of the forearm 655R about point 625R. As a result the arm 650L is extended radially while the arm 650R remains substantially stationary in its retracted position. Retraction of the arm 650R occurs in a substantially opposite manner.

As may be realized, because the end effectors 600L, 600R travel along a common path of travel P, the end effectors may be configured in such a way so as to be in different planes along the path of travel P. In alternate embodiments, the arms 650L, 650R may be configured to be at different heights so that the end effectors can travel along the common path P. In other alternate embodiments, the transport may have any suitable configuration for allowing multiple end effectors to travel along a common path of travel. The illustrated motions of the linkages of the coupling system are merely exemplary and in alternate embodiments the linkages may be arranged to provide and undergo any desired range of motion switching from driving the arms independently of each other.

Figure 10A:
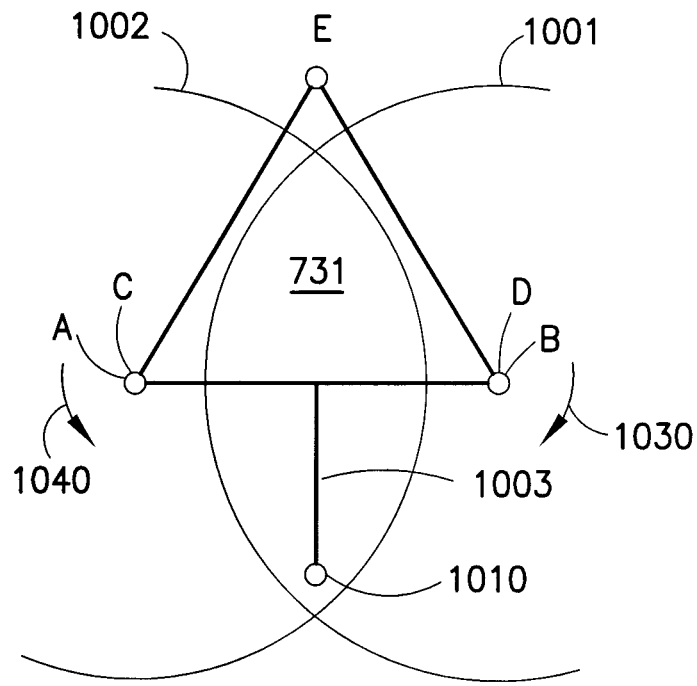
FIG. 10A illustrates a schematic view of a portion of the substrate transport apparatus in FIGS. 6A-6C in accordance with an exemplary embodiment.

Referring now to FIG. 10A, another exemplary embodiment of a drive section is shown. In FIG. 10A only minimal elements of the coupling system are shown for clarity purposes. The drive section shown in FIG. 10A may include a first magnetic stator 1001, a second magnetic stator 1002 and a magnet or magnetic array platen 1010. The magnet platen may be any suitable permanent magnet or magnet array and may have any suitable configuration for a brushless DC or AC motor. In alternate embodiments, the platen may be formed of magnetic material, or may have suitable coils for a motor. The platen 1010 is shown as being mounted to the lever 1003. In FIG. 10A the lever 1003 is shown as extending past the perimeter of the platform 731 for exemplary purposes to illustrate torque application, but in alternate embodiments the lever may have any suitable size and configuration. It should be realized that the placement of the platen 1010 shown in FIG. 10 is merely exemplary and that the platen may be placed in any suitable location from the points C and D to apply a torque on the platform so that the platform can be rotated about either revolute joint C or D. The magnetic stators 1002, 1001 may be any suitable stators configured to drive the magnet 1010 along an arc suitable for rotating platform 731 about point C or D. As can be seen in FIG. 10A, magnetic stator 1002 may for example be centered around point C while magnetic stator 1001 may be centered around point D. In alternate embodiments the magnetic stators may have any suitable configuration for effecting the rotation of the platform. The magnetic stators may be connected to a controller in a suitable manner for producing a magnetic filed for driving the magnets as described above. A common sensor on the platen, such as a Hall effect sensor may be used to control movement of both arms independent of each other.

To rotate the platform 731 about point C in a clockwise direction, power is applied to magnetic stator 1002 to apply a magnetic torque to the platen 1010 so that point B of the platform 731 is rotated in the direction of arrow 1030 as shown in FIGS. 8A-E. To rotate the platform about point D in a counter-clockwise direction, power is applied to magnetic stator 1001 to apply a magnetic torque to the magnet 1010 so that point A of the platform is rotated in the direction of arrow 1040 as shown in FIGS. 8A-C. As may be realized, the polarity of the magnetic stators may be reversed to apply an opposite torque to the magnets for rotating the points A and B back to their starting positions as shown in FIG. 8A.

Figure 10B:
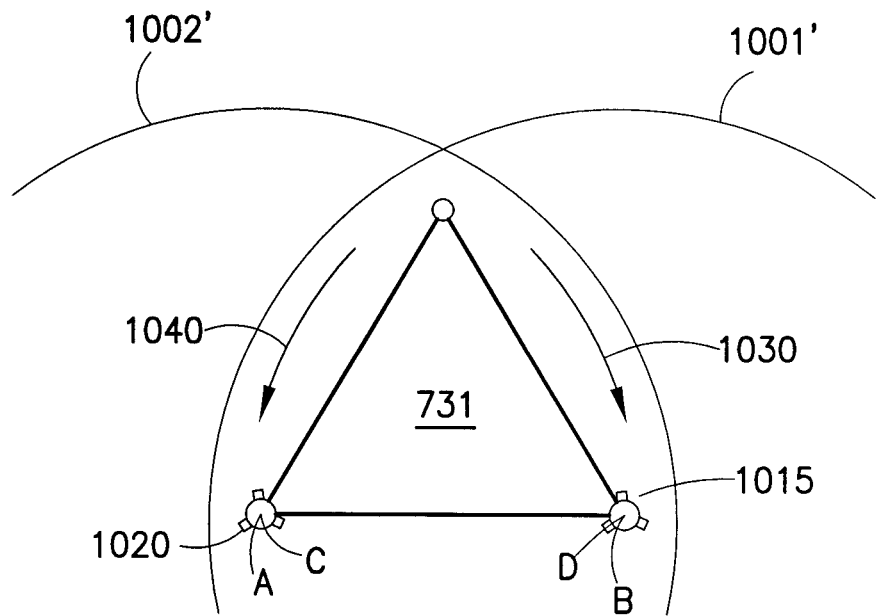
FIG. 10B illustrates a schematic view of a portion of the substrate transport apparatus in FIGS. 6A-6C in accordance with an exemplary embodiment.

Referring to FIG. 10B, another drive section is shown in accordance with an exemplary embodiment. Again only minimal elements of the coupling system are shown in FIG. 10B for clarity. In this exemplary embodiment the drive may include a first magnetic stator 1002', a second magnetic stator 1001', a first magnet(s) platen 1020 and a second magnet(s) platen 1015. In this exemplary embodiment, the platens 1020, 1015 are shown mounted to the platform 731 at points A and B respectively. In alternate embodiments, the platens may be mounted to the platform in any suitable location. The magnetic stators 1002' and 1001' may be substantially similar to those described above with respect to FIG. 10A.

To rotate the platform 731 about point C in a clockwise direction, power is applied to magnetic stator 1002' to apply a magnetic torque to the magnet(s) platen 1015 so that point B of the platform 731 is rotated in the direction of arrow 1030 as shown in FIGS. 8A-E. To rotate the platform about point D in a counter-clockwise direction, power is applied to magnetic stator 1001' to apply a magnetic torque to the magnet(s) platen 1020 so that point A of the platform is rotated in the direction of arrow 1040 as shown in FIGS. 8A-C. As may be realized, the polarity of the magnetic stators may be reversed to apply an opposite torque to the magnets for rotating the points A and B back to their starting positions as shown in FIG. 8A.

Figure 12A:
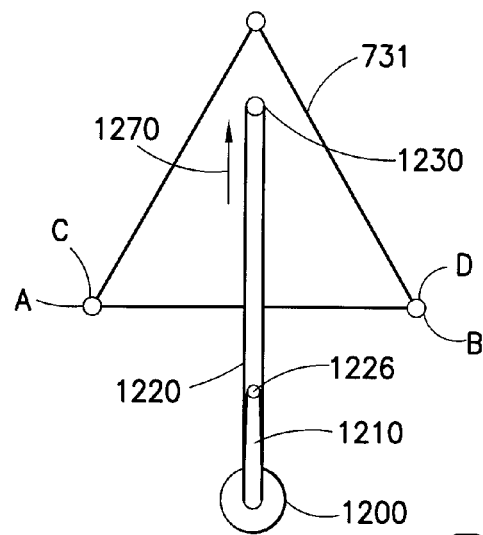
FIGS. 12A-C illustrate schematic views of a portion of the substrate transport apparatus in FIGS. 6A-6C, respectively shown in different positions in accordance with an exemplary embodiment.
Figure 12B:
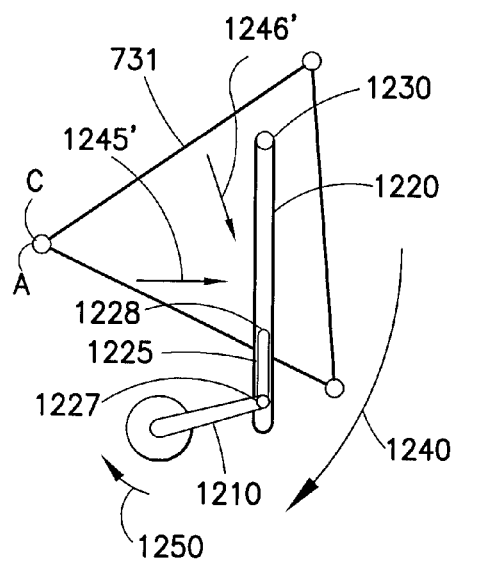
Figure 12C:
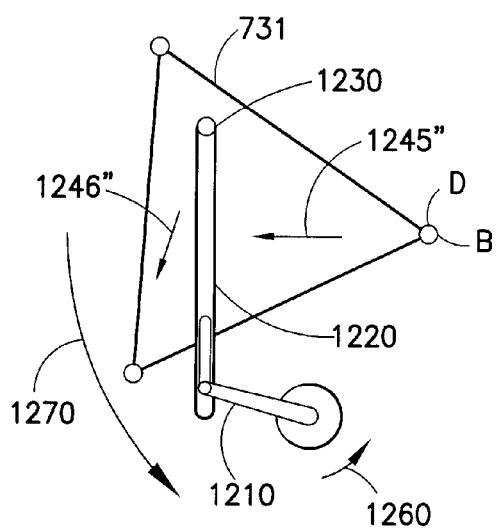

Referring now to FIG. 12A-12C still another exemplary embodiment of a drive section is shown. As can be seen in FIGS. 12A-12C, the drive section may include a drive shaft 1200, a crank member 1210 coupled to the drive shaft 1200 and a connecting link 1220 coupled to one end of the crank member 1210 in a sliding-pivoting arrangement. The sliding-pivoting arrangement may include slot 1225 and pin 1226. The pin 1226 may extend through a hole in the crank 1210 and through the slot 1225. The pin may have suitable ends (e.g. mushroomed ends, capped ends, etc.) to keep the crank 1210 and the connecting link 1220 from separating. The other end of the connecting link 1220 may be pivotally coupled to the platform 731. As shown in FIG. 12B, to rotate the platform in a clockwise direction 1240 the drive shaft 1200 is rotated in a clockwise direction 1250 so that the crank member 1210 is also rotated in a clockwise direction 1250. As the crank member is rotated in the clockwise direction the pin 1226 slides in slot 1225 of the connecting link 1220 such that the end of the connecting link coupled to the crank 1210 is moved in the direction of arrow 1245'. As the crank 1210 rotates the pin 1226 engages a first end 1227 of the slot 1225 so as the crank 1210 rotates further, the rotation of the crank 1210 causes the connecting link 1220 to pull the platform 731 in the direction of arrow 1246' which causes the platform 731 to rotate in the direction of arrow 1240.

Similarly, as shown in FIG. 12C, to rotate the platform in a counter clockwise direction 1270 the drive shaft 1200 is rotated in a counter clockwise direction 1270 so that the crank member 1210 is also rotated in a counter clockwise direction 1260. As the crank member is rotated in the counter clockwise direction the pin 1226 slides in slot 1225 of the connecting link 1220 such that the end of the connecting link coupled to the crank 1210 is moved in the direction of arrow 1245". As the crank 1210 rotates the pin 1226 engages a first end 1227 of the slot 1225 so as the crank 1210 rotates further, the rotation of the crank 1210 causes the connecting link 1220 to pull the platform 731 in the direction of arrow 1246" which causes the platform 731 to rotate in the direction of arrow 1270. As may be realized, the slot 1225 in the connecting link 1220, the connecting link 1210, the crank 1210 and the drive shaft 1200 may be suitably configured/spaced so that as the crank member 1210 is returned to the neutral position shown in FIG. 12A there is suitable travel in the direction of arrow 1270 to allow the platform 731 to return to the neutral position shown in FIG. 12A. For example, as the crank 1210 is returned to the neutral position the pin 1226 engages a second end 1228 of the slot to cause the pivot point 1230 to move in the direction of arrow 1270 so that the platform 731 returns to the neutral position.

As also may be realized, operation of the transport 700 is substantially similar to that described above with respect to FIG. 11 when the magnetic drives of FIGS. 10A-B or the crank drive of FIGS. 11A-C are employed.

Because of the coupling system 800, the rotation of the upper arms 610L, 610R about joints H, I is variable with respect to the rotation of the corresponding drive shaft of the drive system over the extension and retraction of the each of the arms 650L, 650R. The controller 200 may be configured through suitable algorithms so that the arms 650L, 650R maintain a substantially steady state motion during extension and retraction. For example, the controller may cause the drive shaft for the platform 731 to rotate at different speeds at any given time according to the extension or retraction position of the arms so that the extension and retraction of the arms is a substantially uniform motion. In alternate embodiments, the motion of the arms may be controlled in any suitable manner. Sensors to detect and track the extension and retraction of the arms may be located at any suitable point along the arms 650L, 650R such as for example, the revolute joints H, I, 625L and/or 625R. Any suitable number or type of sensors may be utilized. For example, the sensors may be wireless sensors or wired sensors. Feedback from the sensor may be used by the controller 200 for adjusting the rotational speed of the drive shafts.

It is noted that the coupling systems described herein do not increase the mechanical complexity of the substrate transport 300 because the platform 421 and the links 422L, 422R replace a pair of belt drives, where each drive includes two pulleys, a belt, and a belt tensioner. Also, since belt drives are associated with particle generation and reliability problems the coupling system described herein represents a cleaner and more reliable drive system. In addition, the overall complexity of the substrate transport is decreased through the coupling systems because the radial motion of the two arms 491L, 492R is controlled by a single motor, thereby eliminating one of the motors in a conventional substrate transport and its electronic circuitry further improving the reliability and cost aspects of the substrate transport system.

It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate transport apparatus comprising:
a drive section with a drive motor, the drive motor having a common drive shaft;
two articulated arms, each being operably connected to the common drive shaft of the drive motor for extension and retraction of each arm, and each arm having an end effector adapted for holding and transporting a substrate; and
a coupling system having a lost motion system operably coupling both articulated arms to the common drive shaft of the drive motor, the lost motion system including a rotating member coupled to the common drive shaft to rotate about an axis of rotation of the common drive shaft and coupling members movably joined to the rotating member and coupled to a respective one of the two articulated arms through pivotally released joints, the lost motion system being arranged so that the lost motion system operates, when the common drive shaft of the drive motor imparts a torque to the coupling system, to effect extension and retraction of one of the two articulated arms substantially independent of movement of another of the two articulated arms along a substantially common linear path with no more than the common drive shaft effecting extension and retraction of one of the two articulated arms.

2. The apparatus of claim 1, wherein the coupling members comprise substantially rigid coupling elements movably joined to each other and to each of the at least two articulated arms.

3. The apparatus of claim 2, wherein the drive motor is engaged to the common drive shaft and at least one of the coupling elements is movably coupled to the common drive shaft and is driven by the common drive shaft.

4. The apparatus of claim 3, wherein the at least one coupling element is pivotally mounted to the drive shaft and drive shaft rotation pivots the at least one coupling element relative to the drive section.

5. The apparatus of claim 3, wherein drive shaft rotation causes the at least one coupling element to pivot relative to the drive section about two axes of rotation, the two axes are offset and substantially parallel with each other, and wherein the drive section has another axis of rotation offset from at least one of the two axes of rotation.

6. The apparatus of claim 1, wherein the two articulated arms are scara arms and the relationship between scara arm motion and drive motor position is variable over the extension and retraction of each scara arm.

7. The apparatus of claim 6, wherein the apparatus further comprises a controller programmed to control motion of the two scara arms to maintain substantially steady state motion during extension and retraction.

8. The apparatus of claim 1, wherein each pivotally released joint is configured so that a relative position of a respective coupling member with the rotating member is constrained during rotation of the rotating member from a neutral position in a predetermined direction and is pivotally released with respect to the rotating member during rotation of the rotating member from the neutral position in a second predetermined direction.

9. A substrate transport apparatus comprising:
a drive section with a common drive shaft;
multiple articulated arms connected to the drive section, each of the arms having an end effector for holding a substrate, and being capable of extension and retraction for linearly transporting the substrate; and
a coupling system having a substantially rigid base member coupled to the common drive shaft to rotate about an axis of rotation of the common drive shaft and coupling members coupling each arm to the common drive shaft, the base member being movable relative to the drive section and being movably connected to the multiple articulated arms by the coupling members through pivotally released joints allowing relative movement between each arm and the base member;
wherein the movable joints are arranged so that movement of the base member relative to the drive section generates relative movement between the base member and the multiple articulated arms at each of the movable joints causing extension and retraction of at least one of the multiple articulated arms substantially independent of movement of at least another of the multiple articulated arms along a substantially common linear path with no more than the common drive shaft causing extension and retraction of at least one of the multiple articulated arms.

10. The apparatus of claim 1, wherein each pivotally released joint is configured to provide an axis of rotation of the rotating member and pivot about an upper arm axis of rotation of a respective one of the two articulated arms.

* * * * *